United States Patent [19]
Hirade

[11] Patent Number: 6,083,784
[45] Date of Patent: Jul. 4, 2000

[54] SEMICONDUCTOR DEVICE HAVING MOS TRANSISTOR

[75] Inventor: Seiji Hirade, Hamamatsu, Japan

[73] Assignee: Yamaha Corporation, Japan

[21] Appl. No.: 09/021,600

[22] Filed: Feb. 11, 1998

[30] Foreign Application Priority Data

Feb. 12, 1997 [JP] Japan .................................. 9-043019

[51] Int. Cl.[7] ..................... H01L 21/8238; H01L 21/336
[52] U.S. Cl. .......................................... 438/231; 438/301
[58] Field of Search ................................... 438/253, 232, 438/592, 155, 153, 301

[56] References Cited

U.S. PATENT DOCUMENTS

| 5,134,088 | 7/1992 | Zetterlund | 437/60 |
| 5,262,344 | 11/1993 | Mistry | 437/57 |
| 5,304,502 | 4/1994 | Hanagasaki | 437/41 |
| 5,330,929 | 7/1994 | Pfiester et al. | 438/152 |
| 5,532,178 | 7/1996 | Liaw et al. | 437/57 |
| 5,700,734 | 12/1997 | Ooishi | 438/592 |
| 5,770,494 | 6/1998 | Yamamoto et al. | 438/592 |
| 5,776,822 | 7/1998 | Fujii et al. | 438/586 |
| 5,776,823 | 7/1998 | Agnello et al. | 438/592 |
| 5,910,021 | 6/1999 | Tabara | 438/592 |
| 5,930,612 | 7/1999 | Ito | 438/592 |

FOREIGN PATENT DOCUMENTS 5-3173  1/1993  Japan .

Primary Examiner—John F. Niebling
Assistant Examiner—Walter L. Lindsay, Jr.

[57] ABSTRACT

A p type well region, a field insulation film, a gate insulation film, and a gate-use poly-Si layer are formed on the surface of a silicon substrate, after which a laminate of a silicon nitride layer and a resist layer is used as a mask in ion implantation, which forms a low-concentration source region, source contact region, drain region, and drain contact region. Side spacers are formed on both side walls of the gate-use poly-Si layer, after which the laminate of the gate-use poly-Si layer, the side spacers, and the gate insulation film is used along with the field insulation film as a mask to perform ion implantation via the silicon nitride layer, which forms a high-concentration source region and drain region. After a silicide conversion treatment, the unreacted metal is removed, which forms a silicide layer.

24 Claims, 16 Drawing Sheets

SEMICONDUCTOR DEVICE HAVING MOS TRANSISTOR

This application is based on Japanese Patent Application No. 9-43019 filed on Feb. 12, 1997, the entire contents of which are incorporated herein by reference.

BACKGROUND OF THE INVENTION a) Field of the Invention

The present invention relates to a method for manufacturing a semiconductor device, and more particularly relates to a method for manufacturing an integrated circuit (IC) or other such semiconductor device having a MOS transistor.

b) Description of the Related Art

The use of a salicide (self-aligned silicide) process is a known method for manufacturing a MOS transistor with an LDD (Lightly Doped Drain) structure having low-resistance source and drain regions. With this method, the size of the source and drain regions has to be increased in circuit areas that require high resistance, such as input/output protection circuits, and this was disadvantageous in terms of raising the integration of the transistor.

In view of this, methods that improve on the salicide process have been proposed for manufacturing a MOS transistor with an LDD structure having high-resistance source and drain regions (see JP-A-Hei 5-3173, for example). FIGS. 21 to 23 illustrate the steps for manufacturing a MOS transistor having high-resistance source and drain regions and a MOS transistor having low-resistance source and drain regions according to this method.

In the step in FIG. 21, a field insulation film 11 having element holes 11a and 11b is formed on the surface of a p type silicon substrate 10, after which gate insulation films 12a and 12b are formed on the surface of the silicon substrate 10 inside the element holes 11a and 11b. A poly-Si (silicon) layer and a WSi (tungsten silicide) layer are deposited successively on the substrate surface, after which the poly-Si and WSi layers are patterned in the desired gate pattern to form gate electrode layers Ga and Gb over the gate insulation films 12a and 12b, respectively. The gate electrode layer Ga comprises the poly-Si layer 13a and WSi layer 14a remaining after the patterning, and the gate electrode layer Gb comprises the poly-Si layer 13b and WSi layer 14b remaining after the patterning.

Next, the surface of the silicon substrate 10 inside the element holes 11a and 11b is selectively doped with n⁻type impurities using the gate insulation film 12a and the gate electrode layer Ga, the gate insulation film 12b and the gate electrode layer Gb, and the field insulation film 11 as masks, which forms an n⁻type source region 15s and drain region 15d, and forms an n⁻type source region 16s and drain region 16d. A silicon oxide film is deposited on the substrate surface as a side spacer material film, after which this side spacer material film is etched to form side spacers 17s and 17d on both side walls of the gate electrode layer Ga, and to form side spacers 18s and 18d on both side walls of the gate electrode layer Gb. The etching treatment here results in the etching of the portions of the gate insulation films 12a and 12b not covered by the gate electrode layers Ga and Gb and the side spacers 17s, 17d, 18s, and 18d, and in the exposure of the source regions 15s and 16s and drain regions 15d and 16d.

Next, a silicon oxide film is deposited on the substrate surface as an anti-silicide conversion film, after which the anti-silicide conversion film is etched using a resist layer as a mask, which leaves behind an anti-silicide conversion film 19 that covers a first gate component including the gate insulation film 12a, the gate electrode layer Ga, and the side spacers 17s and 17d; a portion Rs of the source region 15s that is adjacent to the first gate component; and a portion Rd of the drain region 15d that is adjacent to the first gate component. After this, a Ti (titanium) film 20 is deposited as a silicide-forming metal film on the substrate surface.

In the step in FIG. 22, after a silicide conversion treatment has been performed, the unreacted portion of the Ti film 20 is removed by etching. As a result, silicide layers 21s, 21d, 22s, and 22d are formed in the source region 15s, the drain region 15d, source region 16s, and the drain region 16d, respectively. No silicide conversion reaction occurs in the WSi layer 14b of the gate electrode layer Gb at this point.

In the step in FIG. 23, the anti-silicide conversion film 19 is removed by etching. The surface of the silicon substrate 10 inside the element holes 11a and 11b is selectively doped with n type impurities via the silicide layers 21s, 21d, 22s, and 22d and using a first gate component including the gate insulation film 12a, the gate electrode layer Ga, and the side spacers 17s and 17d; and a second gate component including the gate insulation film 12b, the gate electrode layer Gb, and the side spacers 18s and 18d; and the field insulation film 11 as masks, which forms an n⁺ type source region 23s and drain region 23d, and forms an n⁺ type source region 24s and drain region 24d.

With the above manufacturing method, as to the MOS transistor formed inside the element hole 11a, no silicide layer is formed on the portion Rs of the source region 23s directly covered by the anti-silicide conversion film 19, or on the portion Rd of the drain region 23d directly covered by the anti-silicide conversion film 19, and both of these portions Rs and Rd are high-resistance components. Meanwhile, as to the MOS transistor formed inside the element hole 11b, since no anti-silicide conversion film such as the film 19 was positioned in either the source region 24s or the drain region 24d, the silicide layers 22s and 22d account for the majority of the source region 24s and the drain region 24d, which means that the source region 24s and the drain region 24d are both low in resistance.

The MOS transistor inside the element hole 11a has high resistance to electrostatic discharge (ESD), and is used for an IC input/output circuit or the like. The MOS transistor inside the element hole 11b, meanwhile, has low resistance to ESD, and is used for an IC internal circuit or the like. With the above manufacturing method, the location where the anti-silicide conversion film 19 is formed may be somewhat out of position due to misalignment during the formation of the resist layer that serves as the etching mask by photolithography. A problem with this is the large amount of variance in the resistance values of the high- and low-resistance components Rs and Rd.

Also, three more steps are required than in an ordinary salicide process, namely, the deposition, patterning, and removal of the anti-silicide conversion film, which is a problem in terms of a greater number of manufacturing steps.

SUMMARY OF THE INVENTION

An object of the present invention is to provide a method for manufacturing a semiconductor device, with which a MOS transistor with high ESD resistance can be manufactured at a good yield.

According to one aspect of the present invention, there is provided a method for manufacturing a semiconductor device, comprising the steps of:

(a) providing a substrate having a first silicon region;

(b) forming a gate electrode layer on said first silicon region so that it is divided into a source disposition component and a drain disposition component;

(c) forming an insulating first mask layer in said source disposition component so that said source disposition component is divided into a first source disposition component and a second source disposition component, and forming an insulating second mask layer in said drain disposition component so that said drain disposition component is divided into a first drain disposition component and a second drain disposition component; and (d) forming a silicide layer over said first and second source disposition components and in said first silicon region located in said first and second drain disposition components, using said first and second mask layers as a mask.

According to another aspect of the present invention, there is provided a method for manufacturing a semiconductor device, comprising the steps of:

providing a substrate having on one principal side a silicon region where there will be formed a MOS transistor having one conduction type of channel;

forming on one principal side of the substrate a field insulation film having element holes located in the silicon region;

covering the silicon surface inside the element holes to form a gate insulation film;

forming a gate electrode layer on the gate insulation film so that the element holes are divided into a source disposition component and a drain disposition component;

disposing an insulating first mask layer in the source disposition component so that the source disposition component is divided into a low-concentration source disposition component close to the gate electrode layer, and a source contact disposition component far from the gate electrode layer, and disposing an insulating second mask layer in the drain disposition component so that the drain disposition component is divided into a low-concentration drain disposition component close to the gate electrode layer, and a drain contact disposition component far from the gate electrode layer;

forming a first source and a first drain region with a relatively low impurity concentration corresponding to the low-concentration source disposition component and the low-concentration drain disposition component, respectively, and forming a source contact region and a drain contact region with a relatively low impurity concentration corresponding to the source contact disposition component and the drain contact disposition component, respectively, by selectively introducing impurities that determine the one conduction type onto the silicon surface inside the element holes, using the gate electrode layer laminated to the gate insulation film, the first and second mask layers, and the field insulation film as a mask;

depositing an insulating side spacer material film that covers the gate insulation film, the gate electrode layer, the first and second mask layers, and the field insulation film;

forming first and second side spacers on the side portions facing the first source and first drain regions in the gate electrode layer by subjecting the side spacer material film to an etch-back treatment so that the first and second mask layers remain, while exposing as components intended for silicide conversion the portion of the first source region interposed between the first side spacer and the first mask layer, the portion of the first drain region interposed between the second side spacer and the second mask layer, the portion of the source contact region adjacent to the portion covered by the first mask layer, and the portion of the drain contact region adjacent to the portion covered by the second mask layer;

forming a second source and a second drain region of a relatively high impurity concentration corresponding to the source disposition component and the drain disposition component, respectively, by selectively introducing impurities that determine the one conduction type to the silicon surface inside the element holes, via the first and second mask layers and using the gate insulation film, the gate electrode layer, the gate component including the first and second side spacers, and the field insulation film as a mask; and using the gate insulation film, the first and second side spacers, the first and second mask layers, and the field insulation film as a mask to perform a silicide conversion treatment in a state in which a silicide-forming metal is in contact with those parts of the first source region, the source contact region, the first drain region, and the drain contact region that are intended for silicide conversion, and then removing the unreacted silicide-forming metal, which results in the formation of first and second source silicide layers in the part of the first source resin intended for silicide conversion and in the part of the source contact region intended for silicide conversion, and in the formation of first and second drain silicide regions in the part of the first drain region intended for silicide conversion and in the part of the drain contact region intended for silicide conversion, which results in the determination of a first resistance component corresponding to the first mask layer between the first and second source silicide layers, and in the determination of a second resistance component corresponding to the second mask layer between the first and second drain silicide layers.

In the source disposition component, the first source region and the source contact region are formed in a self-aligned form in the first mask layer, and in the drain disposition component, the first drain region and the drain contact region are formed in a self-aligned form in the second mask layer. The second source region and the second drain region are then formed corresponding to the source disposition component and the drain disposition component, respectively, by the introduction of impurities via the first and second mask layers. After this, the first and second source silicide layers are formed in a self-aligned form in the first mask layer, and the first and second drain silicide layers are formed in a self-aligned form in the second mask layer, which results in the determination of the first resistance component corresponding to the first mask layer between the first and second source silicide layers, and in the determination of the second resistance component corresponding to the second mask layer between the first and second drain silicide layers.

Therefore, in the formation of the first and second mask layers by selective etching using a resist layer as a mask, even if misalignment of the resist patterning photomask or another such problem causes the position of the first and second mask layers to shift somewhat with respect to the source disposition component and the drain disposition component, this positional variation will result in essentially no variation in the length of the first and second mask layers in the source-drain direction, and in essentially no variation in the resistance of the first and second resistance components. Accordingly, variance in the resistance values of the first and second resistance components can be suppressed.

Also, since the silicide conversion treatment is performed using the first and second mask layers as a mask after high-concentration impurities have been introduced via the first and second mask layers, there is no need to remove the first and second mask layers, so the process is simpler.

In case of using CMOS, since the first and second mask layers are used also for forming LDD structures of a p channel transistor and an n channel transistor, the patterning step is not added and the number of steps does not increase.

Even if the position of the first and second mask layers shifts somewhat with respect to the source disposition component and the drain disposition component in the formation of the first and second mask layers, this positional variation will cause essentially no variation in the resistance of the first and second resistance components, and variance in resistance values can be suppressed. Also, since the first and second mask layers do not need to be removed, fewer steps are entailed by the procedure. As a result, it is possible to manufacture a MOS transistor with high ESD resistance at a good yield.

DESCRIPTION OF THE PREFERRED EMBODIMENTS

Figure 13A:
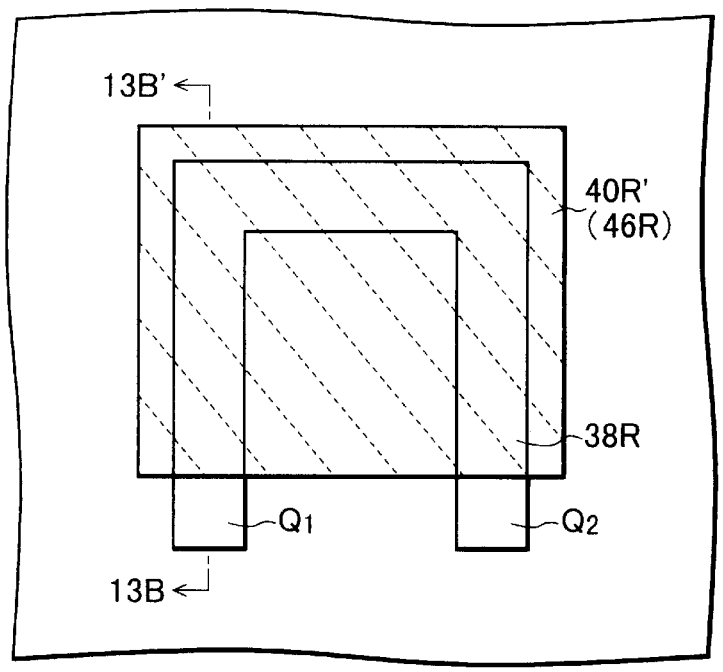
FIGS. 13A and 13B are a plan view and a cross section of the resistance element in the selective etching and ion implantation step in FIGS. 4A to 4C.
Figure 13B:
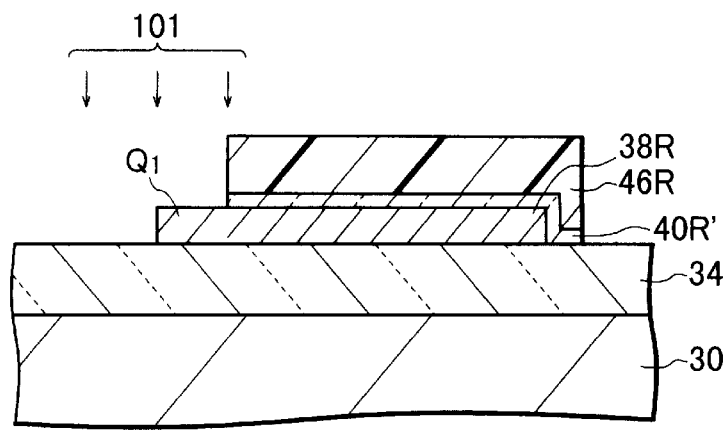
Figure 14A:
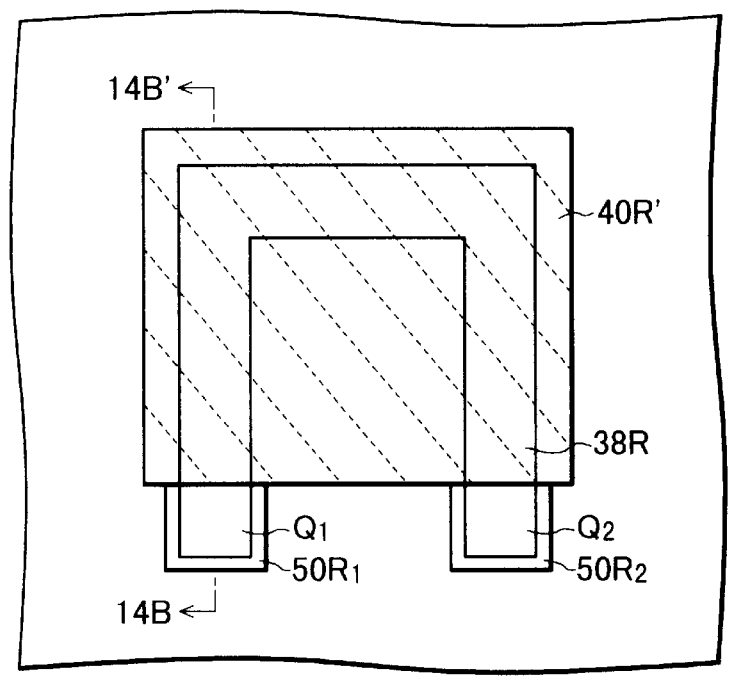
FIGS. 14A and 14B are a plan view and a cross section of the side spacer formation step in FIGS. 5A to 5C.
Figure 14B:
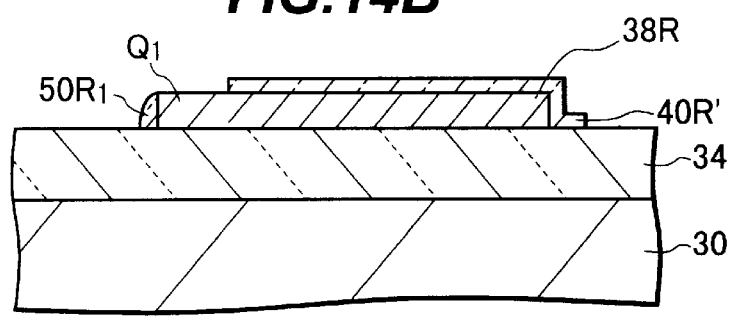
Figure 15:
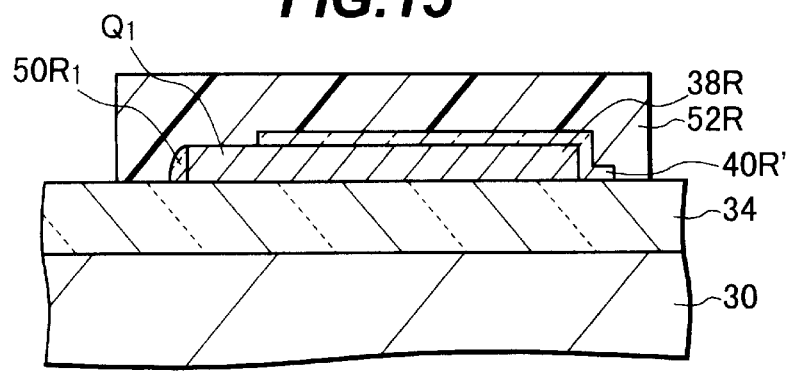
FIG. 15 is a cross section of the resistance element in the selective etching and ion implantation step in FIGS. 6A to 6C.
Figure 16:
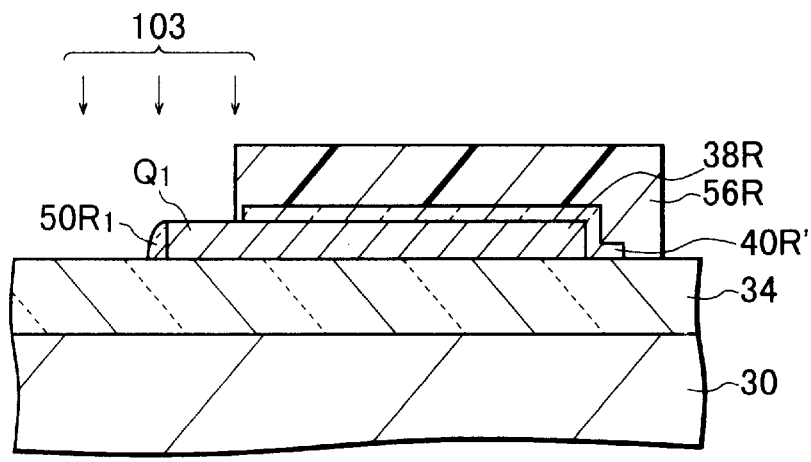
FIG. 16 is a cross section of the resistance element in the selective etching and ion implantation step in FIGS. 7A to 7C.
Figure 17:
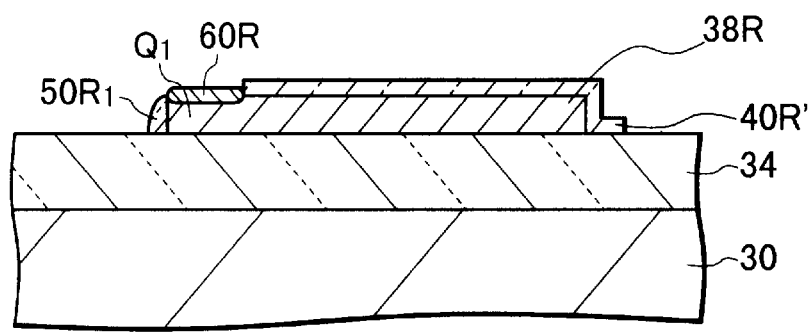
FIG. 17 is a cross section of the resistance element in the silicide conversion step in FIGS. 8A to 8C.

FIGS. 1A to 9C illustrate the steps in the manufacture of a CMOS (Complimentary MOS) type of IC pertaining to an embodiment of the present invention. The steps (1) through (9) corresponding to these respective figures. will now be described in order. FIGS. 1B and 1C are a cross section along the 1B–1B' line in FIG. 1A and a cross section along the 1C–1C' line, respectively. The same relationship between the various FIGS. A and FIGS. B and C applies to FIGS. 2A through 9C as well. FIGS. 10A to 18 illustrate the steps for forming the resistance element in the above-mentioned CMOS IC. FIGS. 10B, 13B, and 14B are cross sections along the 10B–10B', 13B–13B', and 14B–14B' lines in FIGS. 10A, 13A, and 14A, respectively. The same locations as the 10B–10B' line location in FIG. 10A are also shown in FIGS. 11, 12, and 15 to 18.

Figure 1A:
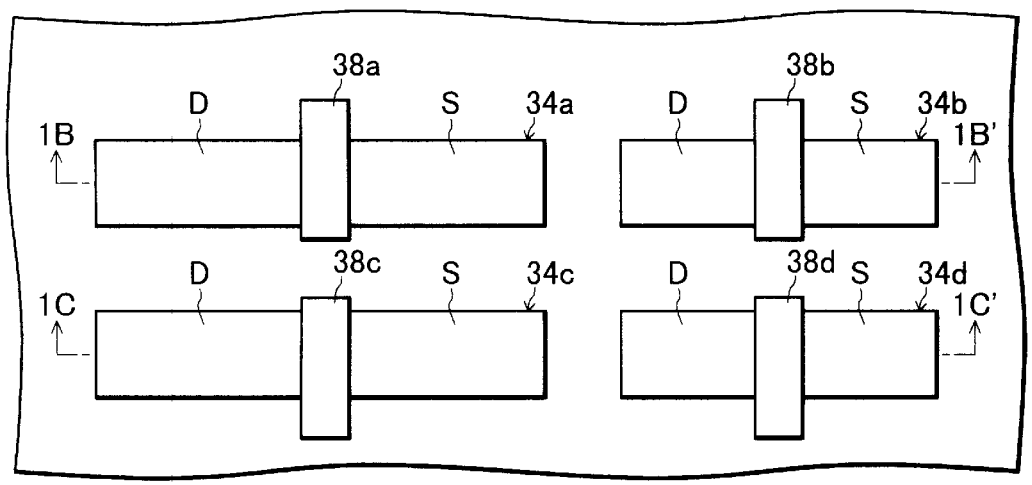
FIGS. 1A to 1C are a plan view and cross sections of the poly-Si patterning step in the method for manufacturing a CMOS type of IC pertaining to an embodiment of the present invention.
Figure 1B:
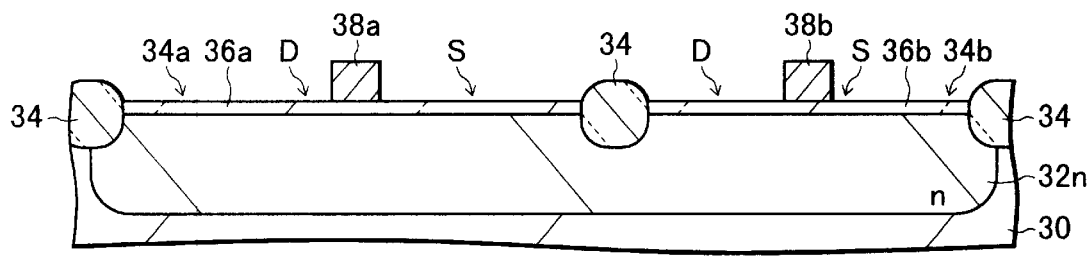
Figure 1C:
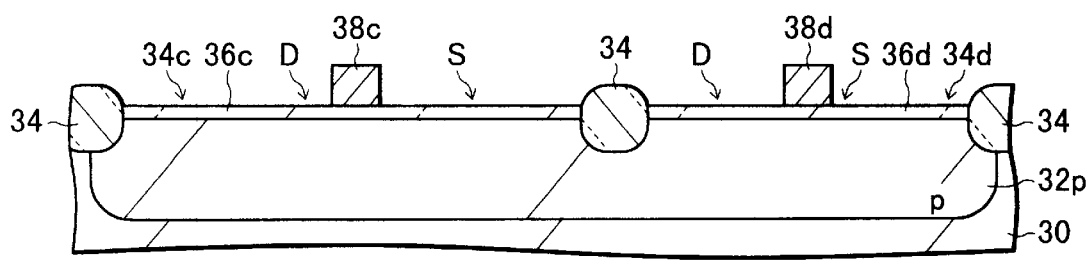
Figure 19:
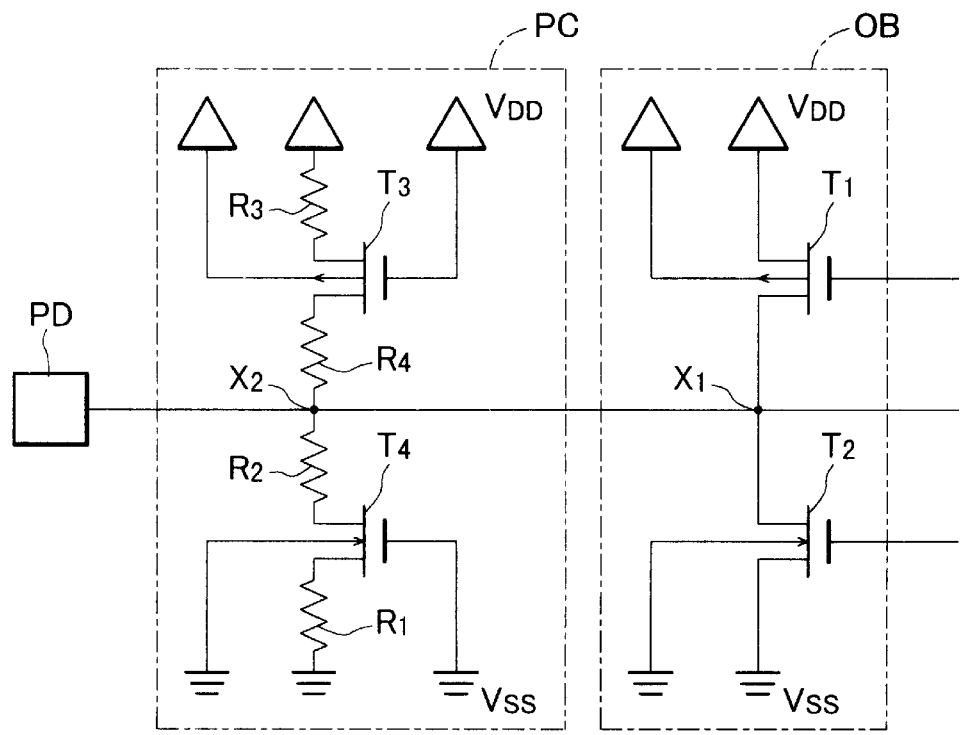
FIG. 19 is a circuit diagram of an equivalent circuit of the IC in FIGS. 9A to 9C.

(1) As shown in FIGS. 1A to 1C, an n type well region $32_n$ and a p type well region $32_p$ are formed on one of the main sides of a silicon substrate 30 by ion implantation or the like, after which a field insulation film 34 having element holes 34a and 34b, which are located over the well region $32_n$, and element holes 34c and 34d, which are located over the well region $32_p$, is formed by selective oxidation (LOCOS). The field insulation film 34 is composed of a silicon oxide film with a thickness of 400 nm, for example. The element holes 34a, 34b, 34c, and 34d are where the p channel MOS transistor $T_3$, the p channel MOS transistor $T_1$, the n channel MOS transistor $T_4$, and the n channel MOS transistor $T_2$ shown in FIG. 19 are respectively disposed. Gate insulation films 36a, 36b, 36c, and 36d are formed by thermal oxidation on the silicon surface inside the element holes 34a, 34b, 34c, and 34d. The gate insulation films 36a to 36d are composed of a silicon oxide film with a thickness of 10 nm, for example.

Next, a poly-Si layer that covers the field insulation film 34 and the gate insulation films 36a and 36d is deposited by chemical vapor deposition (CVD) on the upper surface of the substrate. A poly-Si layer with a thickness of 20 nm can be deposited by low pressure CVD as the poly-Si layer here. Gate-use poly-Si layers 38a, 38b, 38c, and 38d are formed over the gate insulation films 36a, 36b, 36c, and 36d, respectively, by patterning the poly-Si layer according to the desired gate pattern by a known photolithography and selective etching treatment. The poly-Si layer 38a is formed such that the element hole 34a is divided into a source disposition component S and a drain disposition component D, and the poly-Si layers 38b to 38d are similarly formed for the element holes 34b to 34d. With the resistance element disposition component shown in FIGS. 10A and 10B, this poly-Si patterning treatment forms a resistance-use poly-Si layer 38R having a U-shaped pattern in plan view, for example, over the field insulation film 34.

Figure 2A:
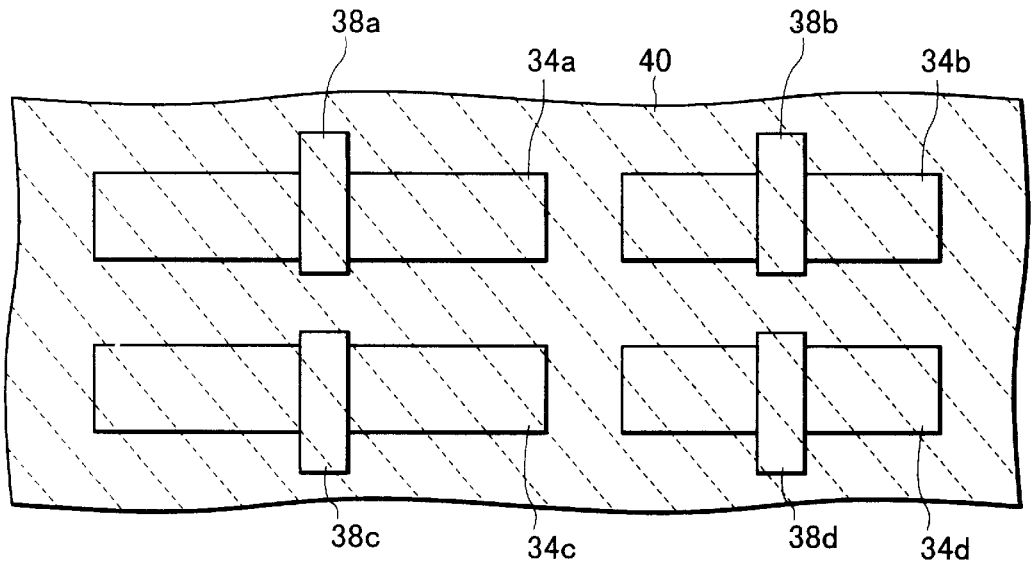
FIGS. 2A to 2C are a plan view and cross sections of the SiN deposition step that follows the step in FIGS. 1A to 1C.
Figure 2B:
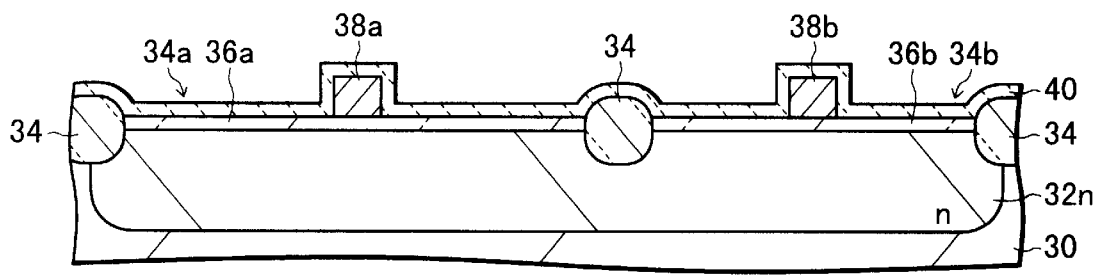
Figure 2C:
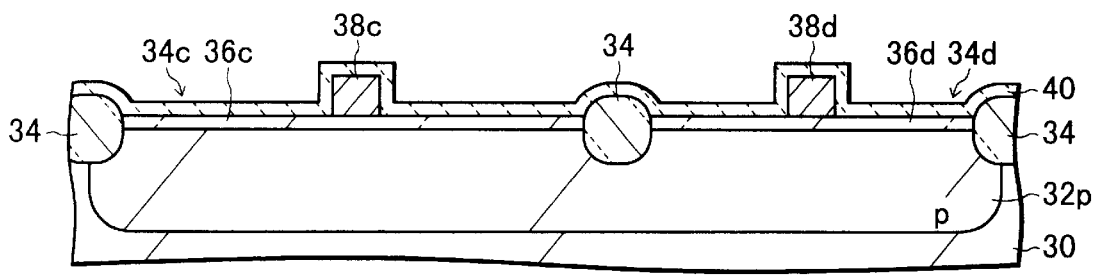

(2) As shown in FIGS. 2A to 2C, a mask-use SiN (silicon nitride) layer 40 that covers the field insulation film 34, the gate insulation films 36a to 36d, and the poly-Si layers 38a to 38d is deposited by CVD or the like on the upper surface of the substrate. The SiN layer 40 is hatched in FIG. 2A. An SiN layer with a thickness of 20 nm can be deposited by low pressure CVD as the SiN layer 40. With the resistance element disposition component shown in FIG. 11, this deposition treatment forms the SiN layer 40 such that it covers the poly-Si layer 38R over the field insulation film 34.

Figure 3A:
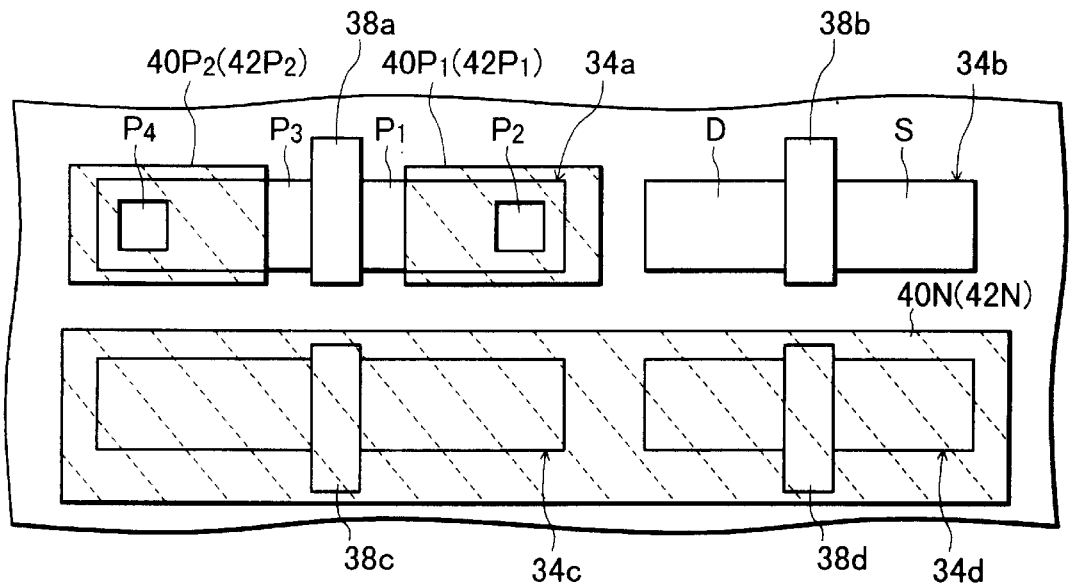
FIGS. 3A to 3C are a plan view and cross sections of the selective etching and ion implantation step that follows the step in FIGS. 2A to 2C.
Figure 3B:
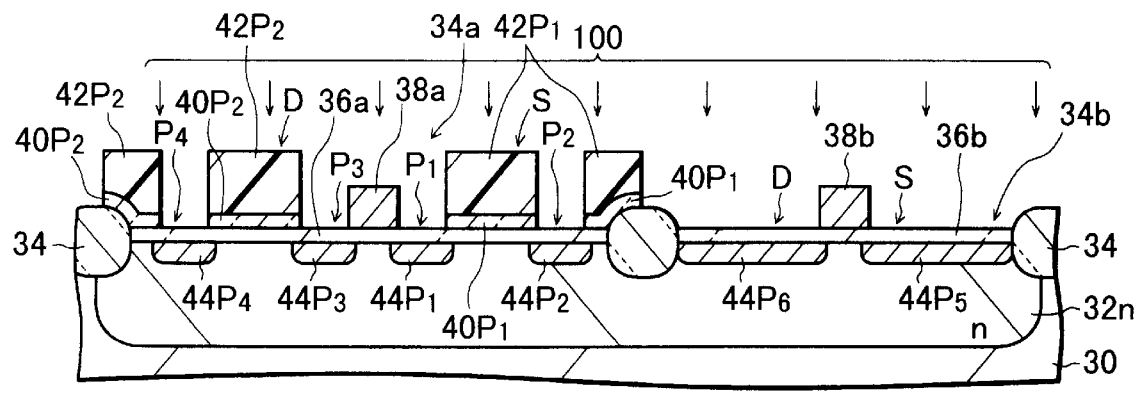
Figure 3C:
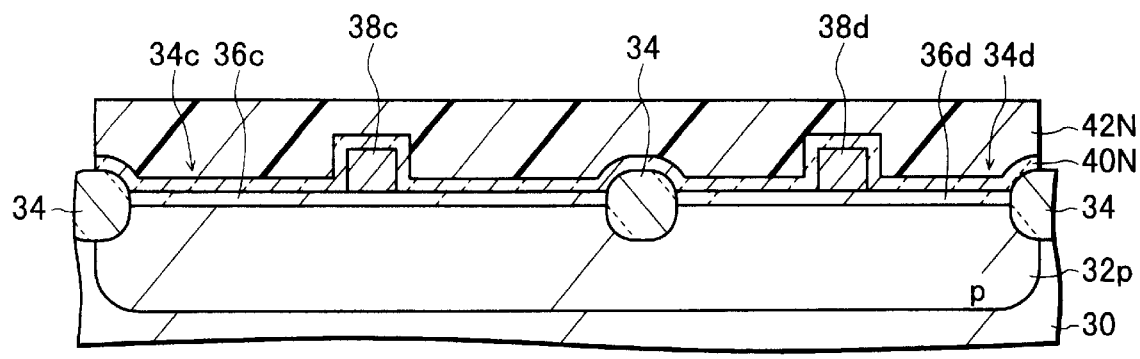

(3) As shown in FIGS. 3A to 3C, a resist layer that covers the SiN layer 40 is formed over the substrate surface and patterned so as to leave behind the resist layers $42P_1$, $42P_2$, and 42N. The resist layer $42P_1$ is left behind in the element hole 34a such that the source disposition component S is divided into a low-concentration source disposition component $P_1$ and a source contact disposition component $P_2$. The resist layer $42P_2$ is left behind in the element hole 34a such that the drain disposition component D is divided into a low-concentration drain disposition component $P_3$ and a drain contact disposition component $P_4$. The resist layer 42N is left behind so as to cover the element holes 34c and 34d. With the resistance element disposition component shown in FIG. 12, a resist layer 42R is left behind by the resist patterning treatment here so as to cover the poly-Si layer 38R.

Next, the SiN layers $40P_1$, $40P_2$, 40N, and 40R are left behind in a planar pattern corresponding to the resist layers $42P_1$, $42P_2$, 40N, and 40R by the selective wet etching or dry etching of the SiN layer 40 using the resist layers $42P_1$, $42P_2$, 40N, and 40R as a mask. A p type source region $44P_1$, a source contact region $44P_2$, a drain region $44P_3$, and a drain contact region $44P_4$ are then formed corresponding to the low-concentration source disposition component $P_1$, the source contact disposition component $P_2$, the low-concentration drain disposition component $P_3$, and the drain contact disposition component $P_4$, respectively, inside the element hole 34a, and the p type source region $44P_5$ and the drain region $46P_6$ are formed corresponding to the source disposition component S and the drain disposition component D, respectively, inside the element hole 34b, by a treatment in which $BF_2$ ions 100 are selectively implanted as p type impurities on the silicon surface inside the element holes 34a and 34b, using as a mask the poly-Si layer 38a laminated to the gate insulation film 36a, the poly-Si layer 38b laminated to the gate insulation film 36b, the resist layer $42P_1$ laminated to the SiN layer $40P_1$, the the resist layer $42P_2$ laminated to the SiN layer $40P_2$, the resist layers 42N and 42R, and the field insulation film 34. The $BF_2$ ions 100 are also implanted in the poly-Si layers 38a and 38b in order to lower the resistance of these layers. The $BF_2$ ions 100 can be implanted under conditions comprising an acceleration voltage of 40 keV and a dose of $2\times10^{13}/cm^2$. After this, the resist layers $42P_1$, $42P_2$, 42N, and 42R are removed by a known ashing treatment or the like.

Figure 4A:
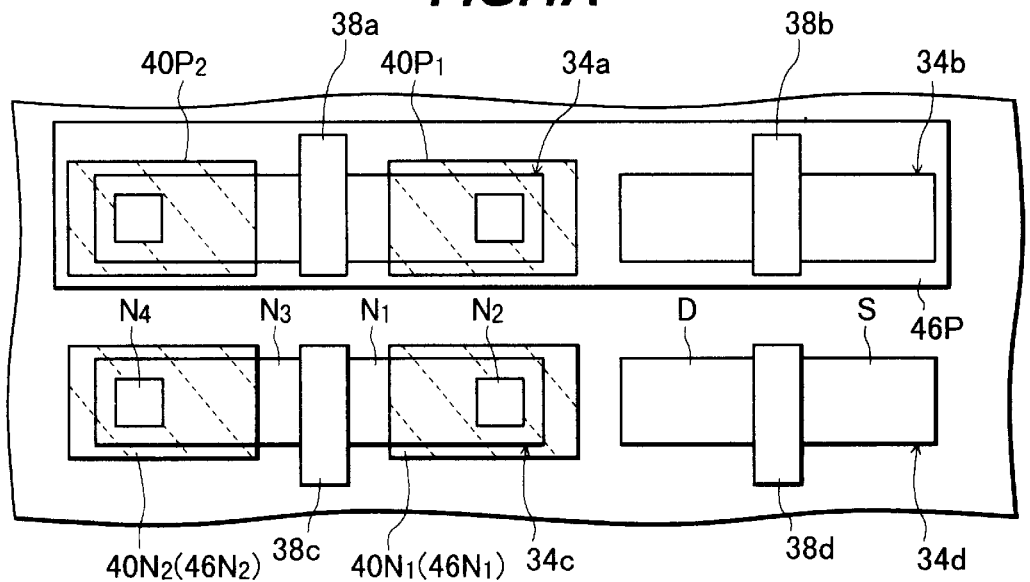
FIGS. 4A to 4C are a plan view and cross sections of the selective etching and ion implantation step that follows the step in FIGS. 3A to 3C.
Figure 4B:
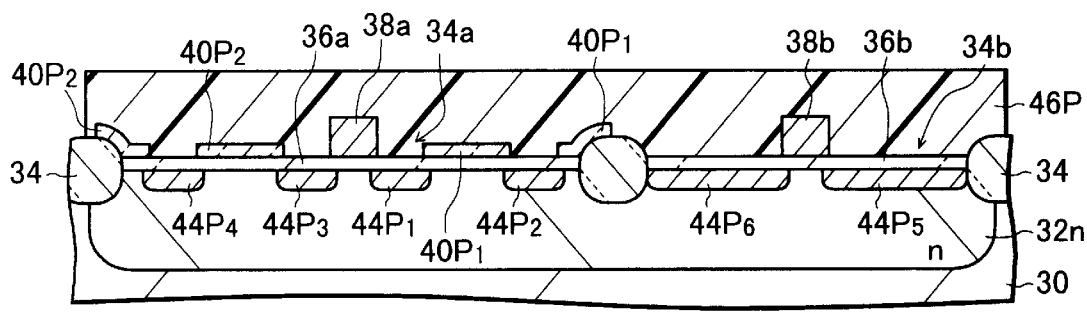
Figure 4C:
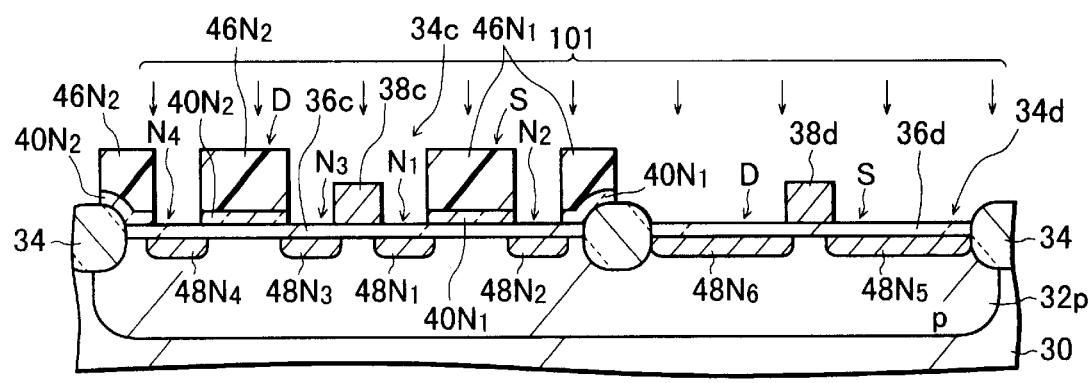

(4) As shown in FIGS. 4A to 4C, a resist layer that covers the field insulation film 34 and the SiN layers $40P_1$, $40P_2$, 40N, and 40R is formed on the upper surface of the substrate, and resist layers $46N_1$, $46N_2$, and 46P are left behind by patterning. The resist layer $46N_1$ is left behind in the element hole 34c so as to divide the source disposition component S into a low-concentration source disposition component $N_1$ and a source contact disposition component $N_2$. The resist layer $46N_2$ is left behind in the element hole 34c so as to divide the drain disposition component D into a low-concentration drain disposition component $N_3$ and a drain contact disposition component $N_4$. The resist layer 46P is left behind so as to cover the element holes 34a and 34b. With the resistance element disposition component shown in FIGS. 13A and 13B, a resist layer 46R is left behind by this resist patterning such that the portion of the poly-Si layer 38R that is supposed to have high resistance is covered and the terminal components $Q_1$ and $Q_2$ are exposed.

Next, the SiN layers $40N_1$, $40N_2$, and 40R' are left behind in a planar pattern corresponding to the resist layers $46N_1$, $46N_2$, and 46R, respectively, by the selective wet etching or dry etching of the SiN layer 40 using the resist layers $46N_1$, $46N_2$, 46P, and 46R as a mask. An n type source region $48N_1$, a source contact region $48N_2$, a drain region $48N_3$, and a drain contact region $48N_4$ are then formed corresponding to the low-concentration source disposition component $N_1$, the source contact disposition component $N_2$, the low-concentration drain disposition component $N_3$, and the drain contact disposition component $N_4$, respectively, inside the element hole 34c, and the n type source region $48N_5$ and the drain region $48N_6$ are formed corresponding to the source disposition component S and the drain disposition component D, respectively, inside the element hole 34d, by a treatment in which P (phosphorus) ions 101 are selectively implanted as n type impurities on the silicon surface inside the element hole 34c and 34d, using as a mask the poly-Si layer 38c laminated to the gate insulation film 36c, the poly-Si layer 38d laminated to the gate insulation film 36d, the resist layer $46N_1$ laminated to the SiN layer $40N_1$, the resist layer $46N_2$ laminated to the SiN layer $40N_2$, the resist layer 46P, and the field insulation film 34. The P ions 101 are also implanted in the poly-Si layers 38c and 38d in order to lower the resistance of these layers. The P ions 101 can be implanted under conditions comprising an acceleration voltage of 40 keV and a dose of $2\times10^{13}/cm^2$. With the resistance element disposition component shown in FIGS. 13A and 13B, as a result of this ion implantation treatment, the resistance of the terminal components $Q_1$ and $Q_2$ of the poly-Si layer 38R is decreased by the doping of the P ions 101 into the terminal components $Q_1$ and $Q_2$, with the laminate of the SiN layer 40R' and the resist layer 46R serving as a mask. After this, the resist layers $46N_1$, $46N_2$, 46P, and 46R are removed.

Figure 5A:
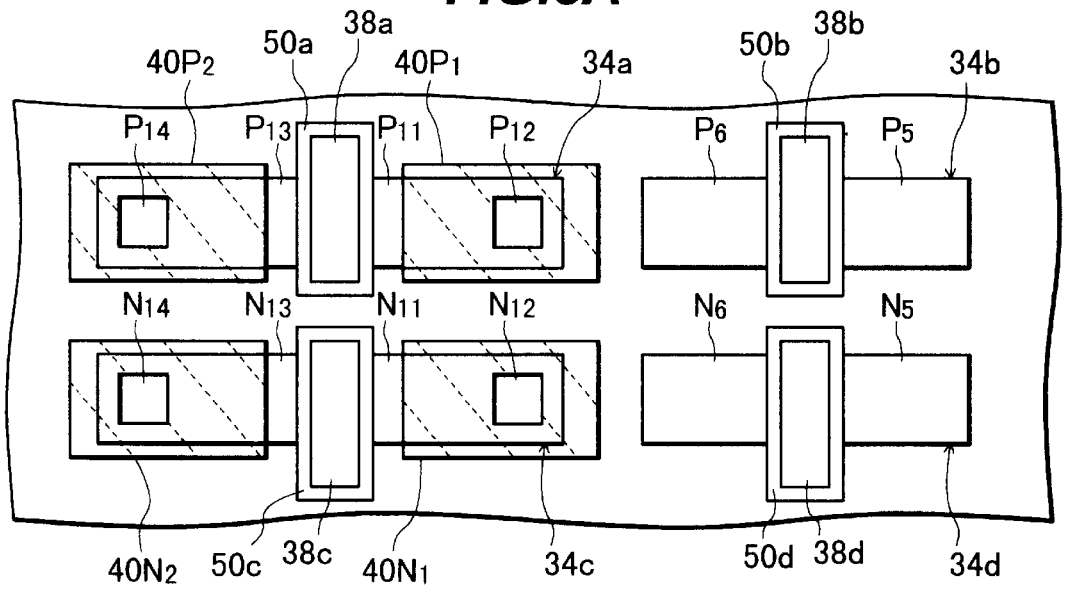
FIGS. 5A to 5C are a plan view and cross sections of the side spacer formation step that follows the step in FIGS. 4A to 4C.
Figure 5B:
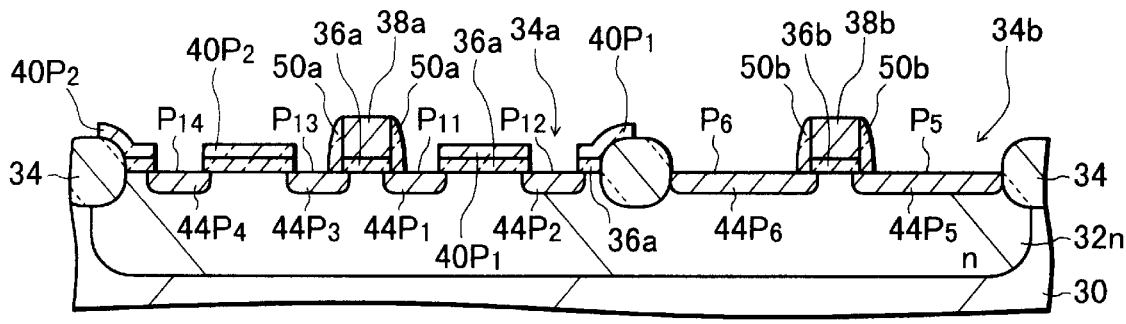
Figure 5C:
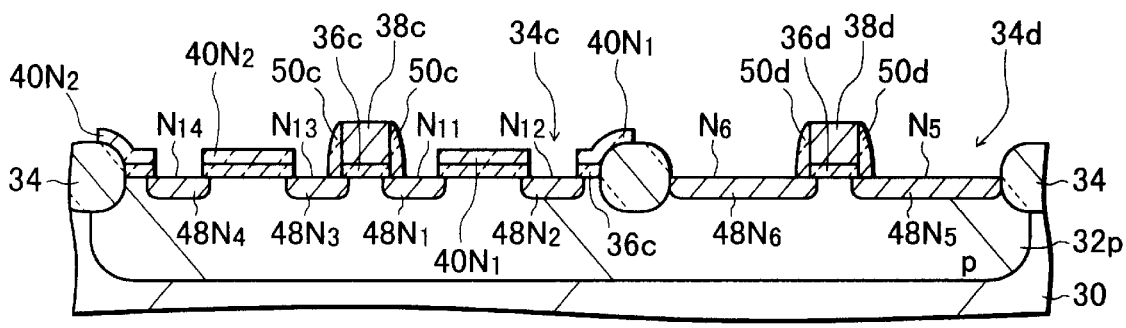

(5) A side spacer material film is deposited on the upper surface of the substrate by CVD or the like so as to cover the gate insulation films 36a to 36d, the poly-Si layers 38a to 38d, the terminal components $Q_1$ and $Q_2$ of the poly-Si layer 38R, the SiN layers $40P_1$, $40P_2$, $40N_1$, $40N_2$, and 40R', and the field insulation film 34. A silicon oxide film with a thickness of 200 nm can be deposited by low pressure CVD as the side spacer material film. The side spacer material film is then subjected to an etch-back treatment so as to leave behind the SiN layers $40P_1$, $40P_2$, $40N_1$, $40N_2$, and 40R', which, as shown in FIGS. 5A to 5C, forms side spacers 50a, 50b, 50c, and 50d on the side walls of the poly-Si layers 38a, 38b, 38c, and 38d, respectively, and at the same time, as shown in FIGS. 14A and 14B, forms side spacers $50R_1$ and $50R_2$ on the side walls of the terminal components $Q_1$ and $Q_2$, respectively, of the poly-Si layer 38R. An anisotropic dry etching treatment in which the etching rate of silicon oxide is sufficiently higher than the etching rate of silicon nitride can be used as the etch-back treatment here (an example of this is given in J. Vac. Sci. Technol. B12(1), January/February 1994, pp. 427–32).

With this etch-back treatment, the gate insulation films 36a to 36d shown in FIGS. 4A to 4C are selectively etched, which exposes that portion $P_{11}$ of the source region $44P_1$ interposed between the side spacer 50a and the SiN layer $40P_1$, exposes that portion $P_{12}$ of the source contact region $44P_2$ not covered by the SiN layer $40P_1$, exposes that portion $P_{13}$ of the of the drain region $44P_3$ interposed between the side spacer 50a and the SiN layer $40P_2$, exposes that portion $P_{14}$ of the drain contact region $44P_4$ not covered by the SiN layer $40P_2$, exposes that portion $P_5$ of the source region $44P_5$ not covered by the poly-Si layer 38b or the side spacer 50b, exposes that portion $P_6$ of the drain region $44P_6$ not covered by poly-Si layer 38b or the side spacer 50b, exposes that portion $N_{11}$ of the source region $48N_1$ interposed between the side spacer 50c and the SiN layer $40N_1$, exposes that portion $N_{12}$ of the source contact region $48N_2$ not covered by the SiN layer $40N_1$, exposes that portion $N_{13}$ of the drain region $48N_3$ interposed between the side spacer 50a and the SiN layer $40N_2$, exposes that portion $N_{14}$ of the drain contact region $48N_4$ not covered by the SiN layer $40N_2$, exposes that portion $N_5$ of the source region $48N_5$ not covered by the poly-Si layer 38b or the side spacer 50b, and exposes that portion $N_6$ of the drain region $48N_6$ not covered by poly-Si layer 38d or the side spacer 50d. The above-mentioned exposed areas are exposed as components intended for silicide conversion. The upper portions of the poly-Si layers 38a to 38d and the upper portions of the terminal components $Q_1$ and $Q_2$ of the poly-Si layer 38R are also exposed as components intended for silicide conversion.

Figure 6A:
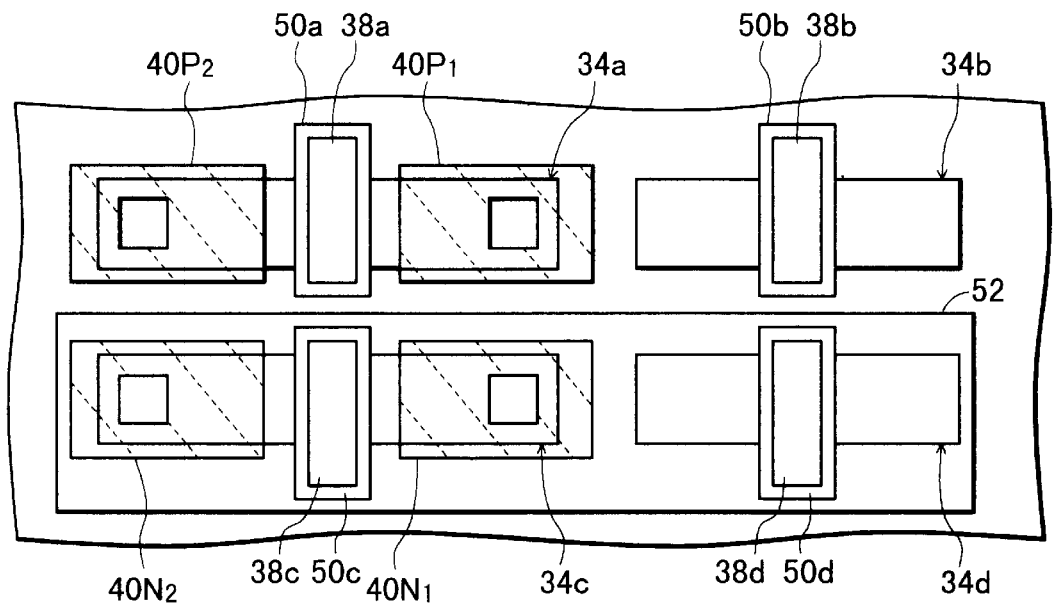
FIGS. 6A to 6C are a plan view and cross sections of the selective etching and ion implantation step that follows the step in FIGS. 5A to 5C.
Figure 6B:
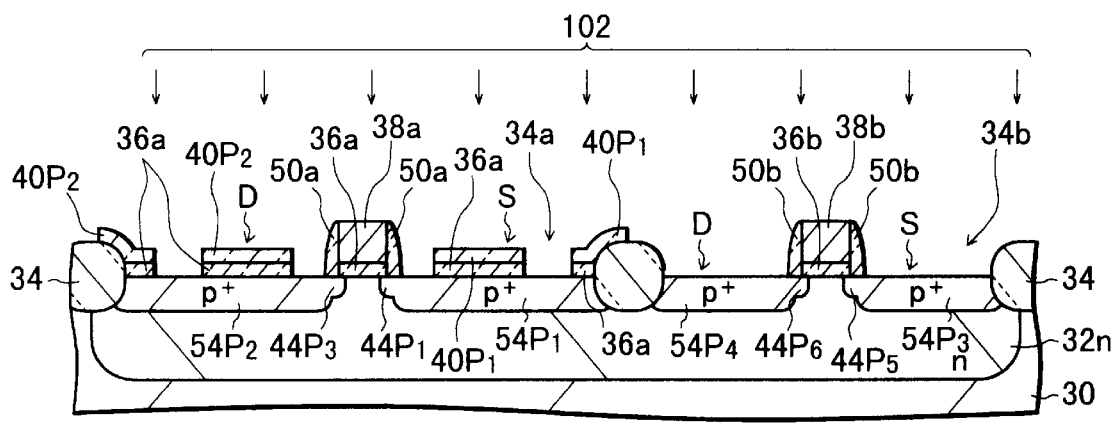
Figure 6C:
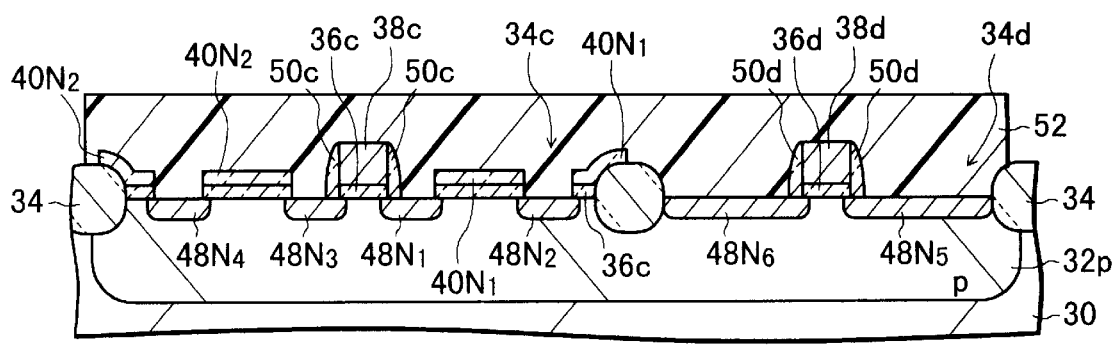

(6) As shown in FIGS. 6A to 6C, a resist layer that covers the element holes 34a to 34d and the field insulation film 34 is formed on the upper surface of the substrate, and then patterned to leave behind a resist layer 52. The resist layer 52 is left behind so as to cover the element holes 34c and 34d. With the resistance element component shown in FIG. 15, a resist layer 52R is left behind by the resist patterning treatment here so as to cover the terminal components $Q_1$ and $Q_2$ of the poly-Si layer 38R, the SiN layer 40R', and the side spacers $50R_1$ and $50R_2$.

Next, $BF_2$ ions 102 are selectively implanted as p type impurities on the silicon surface inside the element holes 34a and 34b via the SiN layers $40P_1$ and $40P_2$ and using as a mask the first gate component shown in FIG. 6B, which includes the gate insulation film 36a, the poly-Si layer 38a, and the side spacer 50a, a second gate component which includes the gate insulation film 36b, the poly-Si layer 38b, and the side spacer 50b, the resist layer 52 shown in FIG. 6C, and the field insulation film 34. This ion implantation treatment forms a p$^+$ type source region $54P_1$ and a p$^+$ type drain region $54P_2$ inside the element hole 34a corresponding to the source disposition component S and the drain disposition component D, respectively, and forms a p$^+$ type source region $54P_3$ and a p$^+$ type drain region $54P_4$ inside the element hole 34b corresponding to the source disposition component S and the drain disposition component D, respectively. The $BF_2$ ions 102 are also implanted in the poly-Si layers 38a and 38b in order to lower the resistance of these layers 38a and 38b. The $BF_2$ ions 102 can be implanted under conditions comprising an acceleration voltage of 50 keV and a dose of $2 \times 10^{15}/cm^2$. After this, the resist layers 52 and 52R are removed.

Figure 7A:
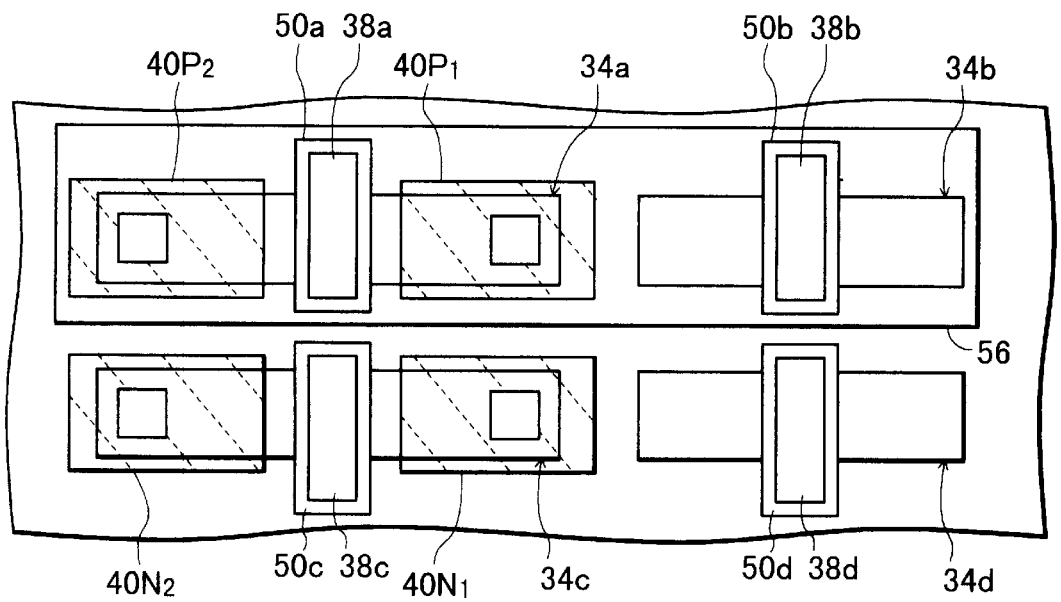
FIGS. 7A to 7C are a plan view and cross sections of the selective etching and ion implantation step that follows the step in FIGS. 6A to 6C.
Figure 7B:
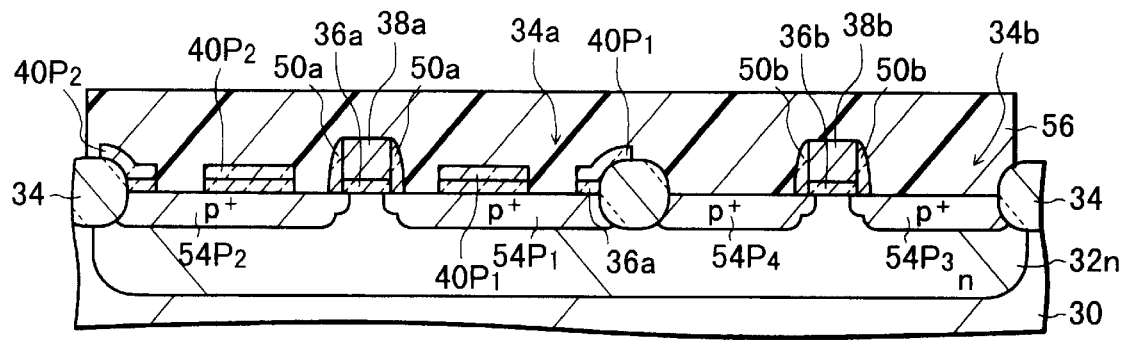
Figure 7C:
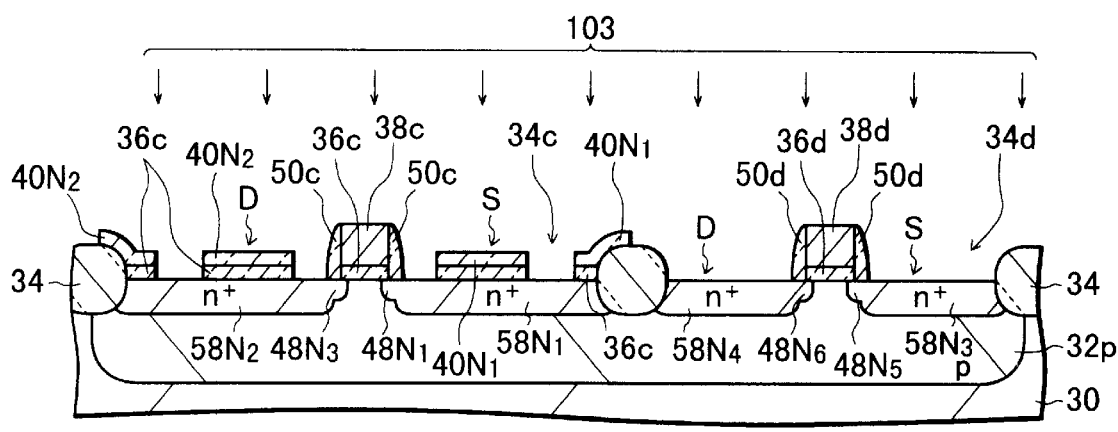

(7) As shown in FIGS. 7A to 7C, a resist layer that covers the element holes 34a to 34d and the field insulation film 34 is formed on the upper surface of the substrate, and resist layer 56 is left behind by patterning. The resist layer 56 is left behind so as to cover the element holes 34a and 34b. With the resistance element disposition component shown in FIG. 16, a resist layer 56R is left behind by this resist patterning such that the SiN layer 40R' is covered and the terminal components $Q_1$ and $Q_2$ of the poly-Si layer 38R are exposed.

Next, P ions 103 are selectively implanted as n type impurities on the silicon surface inside the element holes 34c and 34d via the SiN layers $40N_1$ and $40N_2$ and using as a mask a third gate component which includes the gate insulation film 36c, the poly-Si layer 38c, and the side spacer 50c, a fourth gate component which includes the gate insulation film 36d, the poly-Si layer 38d, and the side spacer 50d, the resist layer 56, and the field insulation film 34. This ion implantation treatment forms an n$^+$ type source region $58N_1$ and an n$^+$ type drain region $58N_2$ inside the element hole 34c corresponding to the source disposition component S and the drain disposition component D, respectively, and forms an n$^+$ type source region $58N_3$ and an n$^+$ type drain region $58N_4$ inside the element hole 34d corresponding to the source disposition component S and the drain disposition component D, respectively. The P ions 103 are also implanted in the poly-Si layers 38c and 38d in order to lower the resistance of these layers 38c and 38d. The P ions 103 can be implanted under conditions comprising an acceleration voltage of 50 keV and a dose of $4 \times 10^{15}/cm^2$. With the resistance element disposition component shown in FIG. 16, the resistance of the terminal components $Q_1$ and $Q_2$ of the poly-Si layer 38R is decreased by the doping of the P ions 103 into the terminal components $Q_1$ and $Q_2$. After this, the resist layers 56 and 56R are removed.

Figure 8A:
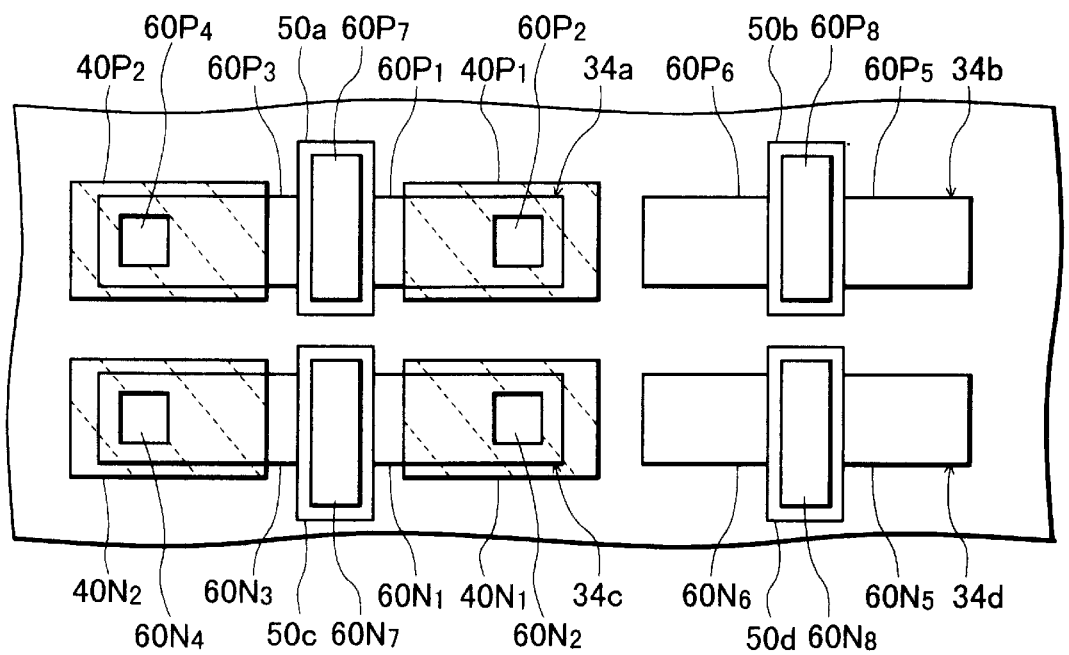
FIGS. 8A to 8C are a plan view and cross sections of the silicide conversion step that follows the step in FIGS. 7A to 7C.
Figure 8B:
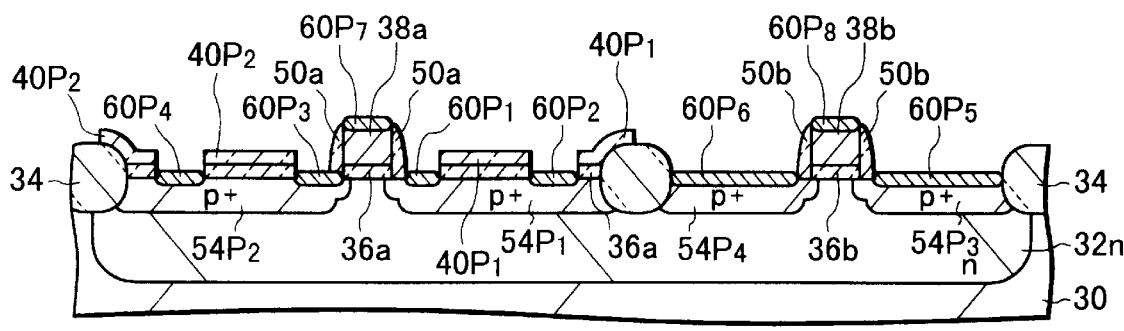
Figure 8C:
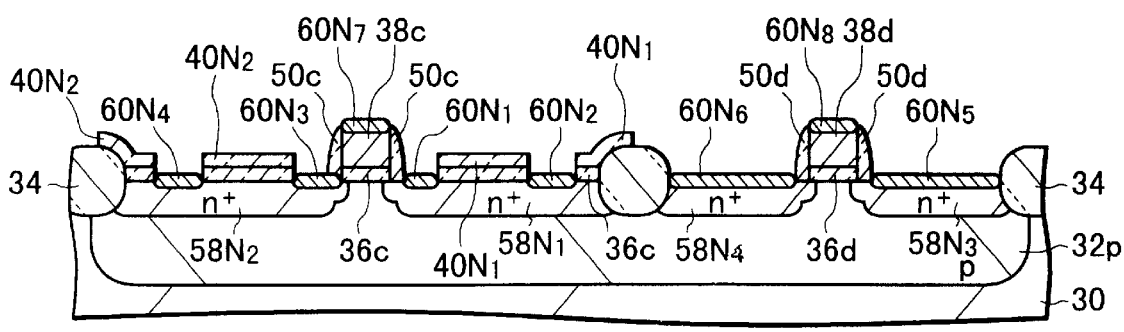

(8) A silicide-forming metal film is deposited over the entire upper surface of the substrate. A Ti film with a thickness of 50 nm can be deposited by sputtering as this silicide-forming metal film. A silicide conversion treatment is performed in a state in which the Ti film is in contact with the component intended for silicide conversion mentioned above in relation to FIGS. 5A to 5C, using the gate insulation films 36a to 36d, the SiN layers $40P_1$, $40P_2$, $40N_1$, and $40N_2$, the side spacers 50a to 50d, and the field insulation film 34 as a mask. After this, the unreacted silicide-forming metal is removed from the upper surface of the substrate by etching, which, as shown in FIGS. 8A to 8C, forms source silicide layers $60P_1$ and $60P_2$ in the source region $54P_1$, forms drain silicide layers $60P_3$ and $60P_4$ in the drain region $54P_2$, forms a source silicide layer $60P_5$ in the source region $54P_3$, forms a drain silicide layer $60P_6$ in the drain region $54P_4$, forms source silicide layers $60N_1$ and $60N_2$ in the source region $58N_1$, forms drain silicide layers $60N_3$ and $60N_4$ in the drain region $58N_2$, forms a source silicide layer $60N_5$ in the source region $58N_3$, forms a drain silicide layer $60N_6$ in the drain region $58N_4$, and forms gate silicide layers $60P_7$, $60P_8$, $60N_7$, and $60N_8$ over the poly-Si layers 38a, 38b, 38c, and 38d, respectively. A heat treatment lasting several dozen seconds at 600 to 700° C. can be performed as the Ti silicide conversion treatment here. With the resistance element disposition component shown in FIG. 17, this silicide conversion treatment forms a silicide layer 60R at the terminal component $Q_1$ of the poly-Si layer 38R, and forms a silicide layer (not shown) at the terminal component $Q_2$ of the poly-Si layer 38R, in both cases using the SiN layer 40R' and the side spacer $50R_1$ as a mask.

After this, a heat treatment is performed in order to lower the resistance of the silicide layers $60P_1$ to $60P_8$ and $60N_1$ to $60N_8$. In the case of Ti silicide, this heat treatment can be carried out under conditions comprising a few seconds to a few dozen seconds at 800 to 900° C.

Figure 9A:
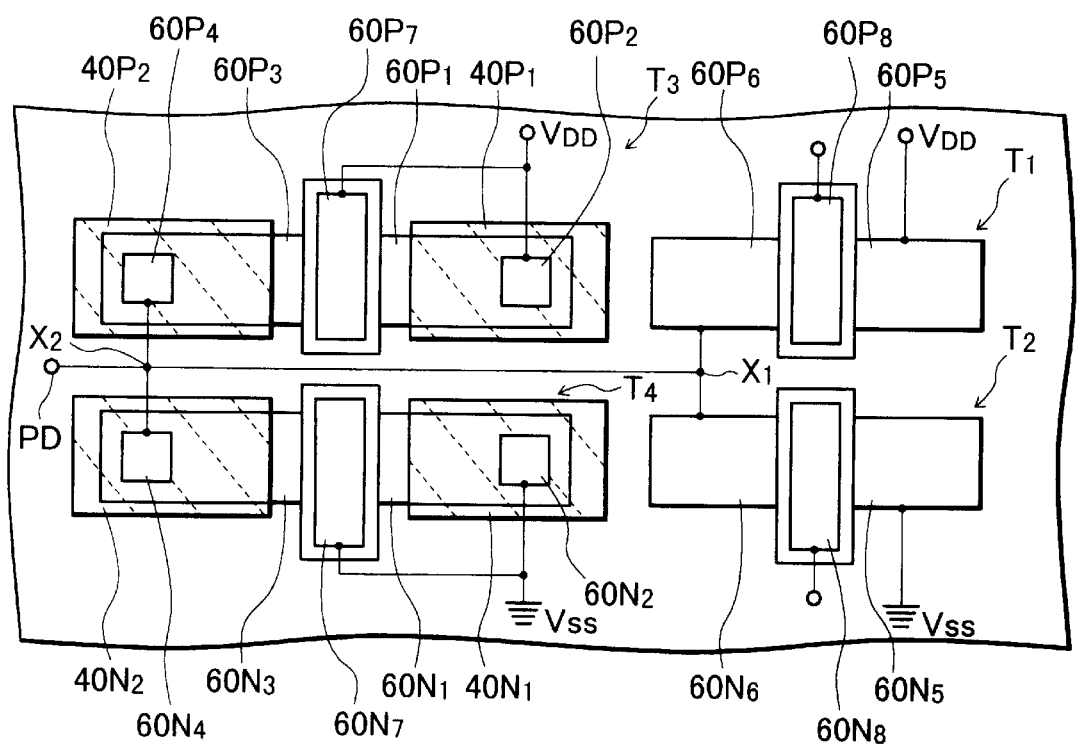
FIGS. 9A to 9C are a plan view and cross sections of the insulation film formation and wiring formation step that follows the step in FIGS. 8A to 8C.
Figure 9B:
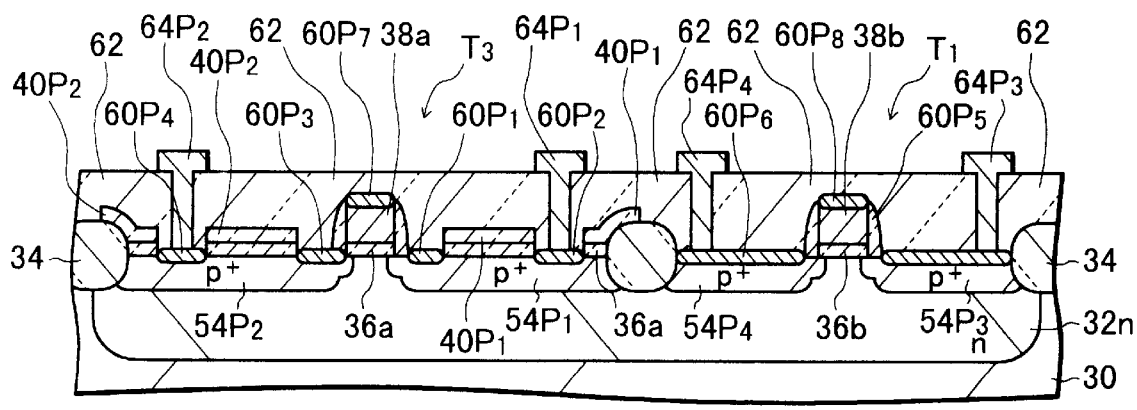
Figure 9C:
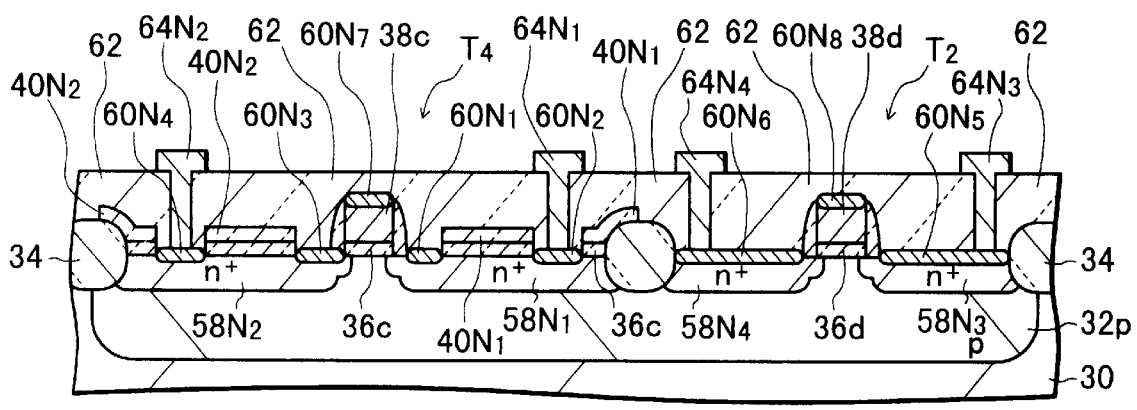
Figure 10A:
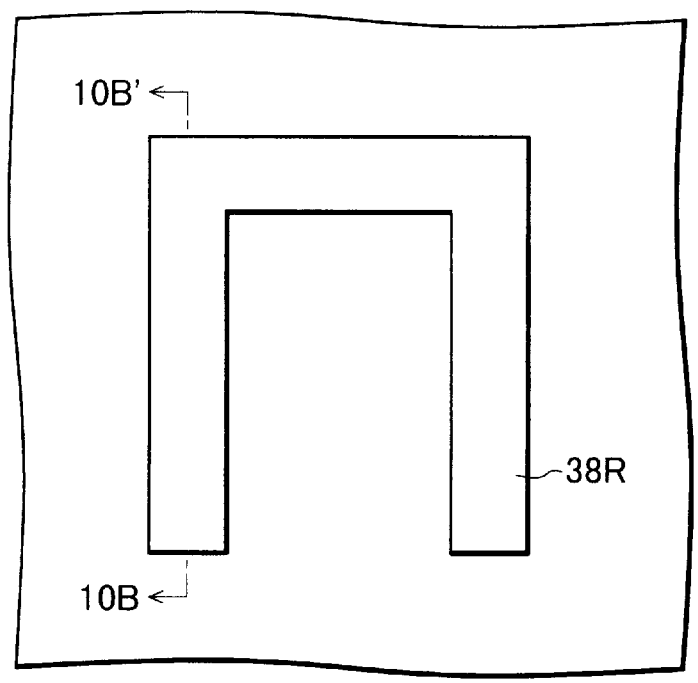
FIGS. 10A and 10B are a plan view and a cross section of the resistance element in the poly-Si patterning step.
Figure 10B:
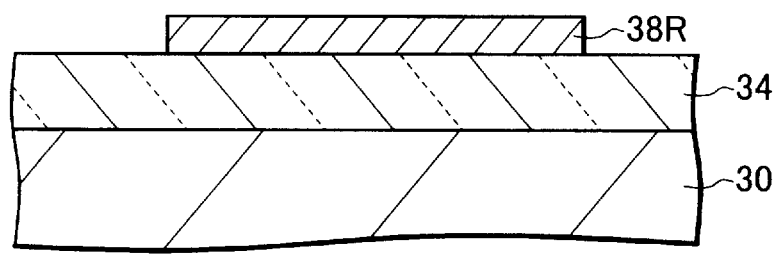
Figure 11:
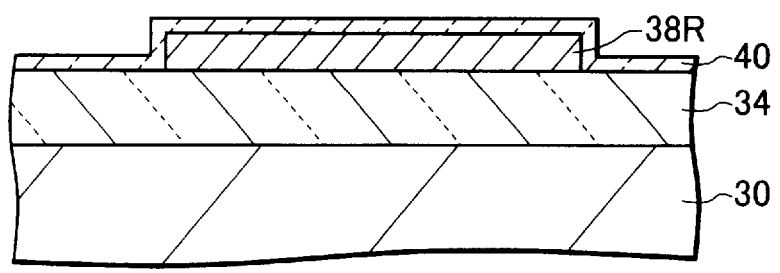
FIG. 11 is a cross section of the resistance element in the SiN deposition step in FIGS. 2A to 2C.
Figure 12:
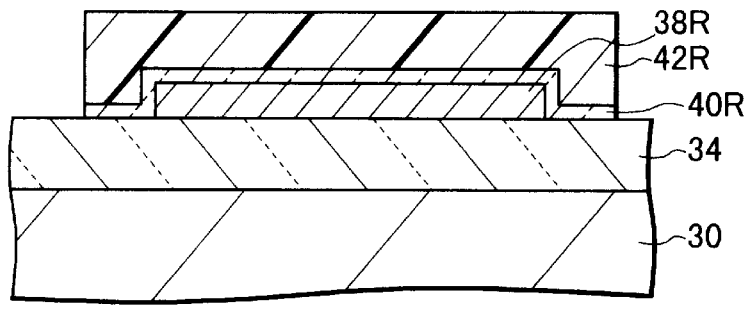
FIG. 12 is a cross section of the resistance element in the selective etching and ion implantation step in FIGS. 3A to 3C.

(9) As a preliminary stage in the manufacture of the substrate shown in FIGS. 9A to 9C, a silicon oxide or other such interlayer insulation film 62 is formed over the entire upper surface of the substrate. The desired connection holes are then formed in the interlayer insulation film 62 by photolithography and selective etching. After this, an Al alloy or other such wiring material layer is deposited over the interlayer insulation film 62, and this is patterned to form the wiring layers $64P_1$ to $64P_4$ and $64N_1$ to $64N_4$ shown in FIGS. 9A to 9C. The wiring layers $64P_1$ and $64P_2$ are connected to the silicide layers $60P_2$ and $60P_4$, respectively. The wiring layers $64P_3$ and $64P_4$ are connected to the silicide layers $60P_5$ and $60P_6$, respectively. The wiring layers $64N_1$ and $64N_2$ are connected to the silicide layers $60N_1$ and $60N_2$, respectively. The wiring layers $64N_3$ and $64N_4$ are connected to the silicide layers $60N_5$ and $60N_6$, respectively.

Figure 18:
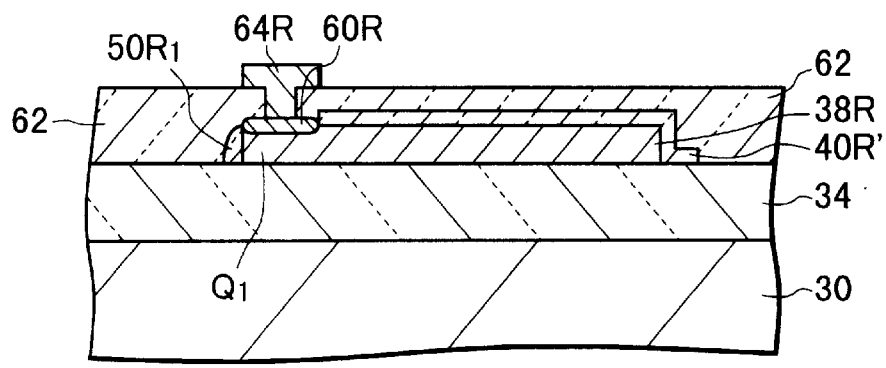
FIG. 18 is a cross section of the resistance element in the insulation film formation and wiring formation step in FIGS. 9A to 9C.

With the resistance element disposition component shown in FIG. 18, the interlayer insulation film 62 is formed over the field insulation film 34 so as to cover the SiN layer 40R', the side spacers $50R_1$ and $50R_2$, the silicide layer 60R, and so on in the interlayer insulation film formation step discussed above. Also, just as in the connection hole formation and wiring formation step discussed above, a wiring layer 64R that is linked to the silicide layer 60R over the terminal component $Q_1$ of the poly-Si layer 38R is formed, and a wiring layer (not shown) that is linked to the silicide layer over the terminal component $Q_2$ of the poly-Si layer 38R is similarly formed.

As a result of the above manufacturing steps, the MOS transistors $T_3$, $T_1$, $T_4$, and $T_2$ shown in FIG. 19 are respectively formed in the well regions $32_n$ and $32_p$. The transistor $T_3$ has a p channel. A resistance component corresponding to the resistor $R_3$ in FIG. 19 is determined between the silicide layers $60P_1$ and $60P_2$ in the source region $54P_1$ of the transistor $T_3$. A resistance component corresponding to the resistor $R_4$ in FIG. 19 is determined between the silicide layers $60P_3$ and $60P_4$ in the drain region $54P_2$ of the transistor $T_3$. The transistor $T_1$ has a p channel. The silicide layer $60P_5$ accounts for the majority of the source region $54P_3$ in the transistor $T_1$, and the silicide layer $60P_6$ accounts for the majority of the drain region $54P_4$. The transistor $T_4$ has an n channel. A resistance component corresponding to the resistor $R_1$ in FIG. 19 is determined between the silicide layers $60N_1$ and $60N_2$ in the source region $54N_1$ of the transistor $T_4$, and a resistance component corresponding to the resistor $R_2$ in FIG. 19 is determined between the silicide layers $60N_3$ and $60N_4$ in the drain region $58N_2$. The transistor $T_2$ has an n channel, and the silicide layer $60N_5$ accounts for the majority of the source region $58N_3$, while the silicide layer $60N_6$ accounts for the majority of the drain region $58N_4$.

Therefore, the transistors $T_1$ and $T_2$ both have low-resistance source and drain regions, while the transistors $T_3$ and $T_4$ both have high-resistance source and drain regions. Accordingly, the transistors $T_3$ and $T_4$ have higher ESD resistance than transistors $T_1$ and $T_2$.

As a result of the above manufacturing steps, variance in the resistance values of the resistance components can be suppressed for both of the transistors $T_3$ and $T_4$, and the number of steps can be reduced. For instance, with the transistor $T_4$, since the silicide layers $60N_1$ to $60N_4$ are formed so that they are self-aligning with the SiN layers $40N_1$ and $40N_2$, even if misalignment of the photomask position during the photolithography treatment causes the formation location of the SiN layers $40N_1$ and $40N_2$ to be somewhat shifted, there will be essentially no fluctuation in either the resistance of the resistance component determined according to the SiN layer $40N_1$ between the silicide layers $60N_1$ and $60N_2$, or the resistance of the resistance component determined according to the SiN layer $40N_2$ between the silicide layers $60N_3$ and $60N_4$. Also, there is no need to remove the SiN layers $40N_1$ and $40N_2$ since the silicide conversion treatment is performed using the SiN layers $40N_1$ and $40N_2$ as a mask after the impurity doping has been performed in order to form the $n^+$ regions $58N_1$ and $58N_2$ via the SiN layers $40N_1$ and $40N_2$.

With the manufacturing steps discussed above, a low-resistance gate electrode and gate wiring can be achieved since the gate-use poly-Si layers $38a$ to $38d$ are twice subjected to impurity doping, and the silicide layers $60P_7$, $60P_8$, $60N_7$, and $60N_8$ are formed. In FIG. 18, with the poly-Si layer 38R, the resistance is lowered in the terminal components $Q_1$ and $Q_2$ by the two dopings of impurities and the formation of the silicide layer 60R, and the portions intended for resistance are covered with the SiN layer 40R' and the resist layers 46R and 56R, so high resistance can be achieved with good precision.

With the manufacturing steps discussed above, an IC comprising complimentary MOS transistors $T_3$ and $T_4$ having high-resistance source and drain regions, and a high-resistance resistance element (38R in FIG. 18) can be manufactured by a simple procedure. Specifically, in FIGS. 3A to 3C, the resist layers $42P_1$ and $42P_2$ are formed along with the resist layer 42N patterning step, in FIGS. 4A to 4C, the resist layers $46N_1$, $46N_2$, and 46R are formed along with the resist layer 46P patterning step, and the resist layers 52R (FIG. 15) and 56R (FIG. 16) are formed along with the patterning steps for the resist layers 52 (FIGS. 6A to 6C) and 56 (FIGS. 7A to 7C), respectively, so the number of photolithography steps is the same as in a CMOS IC manufacturing method that makes use of an ordinary salicide process, and no new photolithography step need be added.

In case of using CMOS, since the SiN layers $40P_1$, $40P_2$, $40N_1$, $40N_2$ are used also for forming LDD structures of the transistor $T_3$ and $T_4$, the patterning step is not added and the number of steps does not increase.

FIGS. 9A to 9C and FIG. 19 illustrate examples of a protection circuit PC structured so as to take advantage of the features of the transistors $T_3$ and $T_4$, namely, high ESD resistance. The protection circuit PC is connected between an output buffer OB and a pad electrode (a so-called bonding pad) PD that is provided as an output terminal to the upper portion of the substrate 30. The wiring of the well regions $32_n$ and $32_p$ is not shown in FIGS. 9A to 9C, but is indicated as substrate wiring in FIG. 19.

In the output buffer OB, the drain silicide layer $60P_6$ of the transistor $T_1$ and the drain silicide layer $60N_6$ of the transistor $T_2$ are connected to one another, and the connection point $X_1$ thereof is connected to the pad electrode PD. The n type well region $32_n$ and the source silicide layer $60P_5$ of the transistor $T_1$ and are connected to a power supply line of high potential $V_{DD}$. The p type well region $32_p$ and the source silicide layer $60N_5$ of the transistor $T_2$ are connected to a power supply line of low potential $V_{SS}$. The drain connection point $X_1$ of the transistors $T_1$ and $T_2$, the gate silicide layer $60P_8$ of the transistor $T_1$, and the gate silicide layer $60N_8$ of the transistor $T_2$ are each connected to an internal circuit of the IC.

In the protection circuit PC, the drain silicide layer $60P_4$ of the transistor $T_3$ and the drain silicide layer $60N_4$ of the transistor $T_4$ are connected to one another, and the connection point $X_2$ thereof is connected to the pad electrode PD. The n type well region $32_n$, the gate silicide layer $60P_7$, and the source silicide layer $60P_2$ of the transistor $T_3$ are connected to a power supply line of high potential $V_{DD}$. The p type well region $32_p$, the gate silicide layer $60N_7$, and the source silicide layer $60N_2$ of the transistor $T_4$ are connected to a power supply line of low potential $V_{SS}$.

Figure 20:
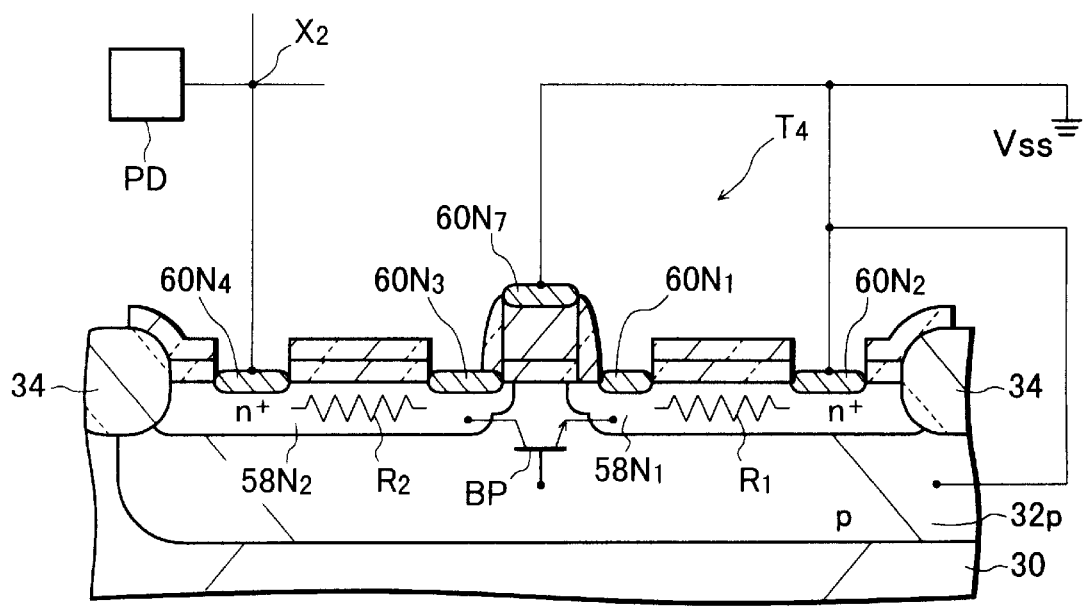
FIG. 20 is a cross section that illustrates the protection of the circuit in FIG. 19.
Figure 21:
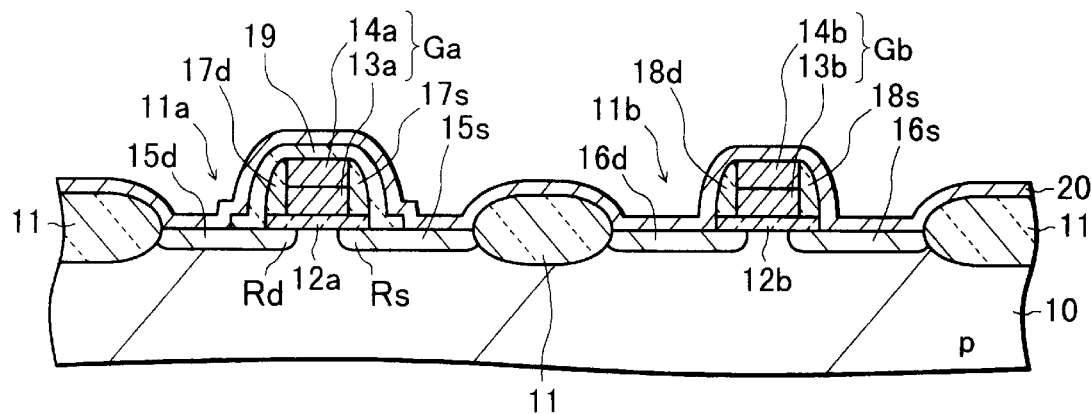
FIGS. 21 to 23 are cross sections of the main steps in a conventional method for manufacturing a CMOS type of IC.
Figure 22:
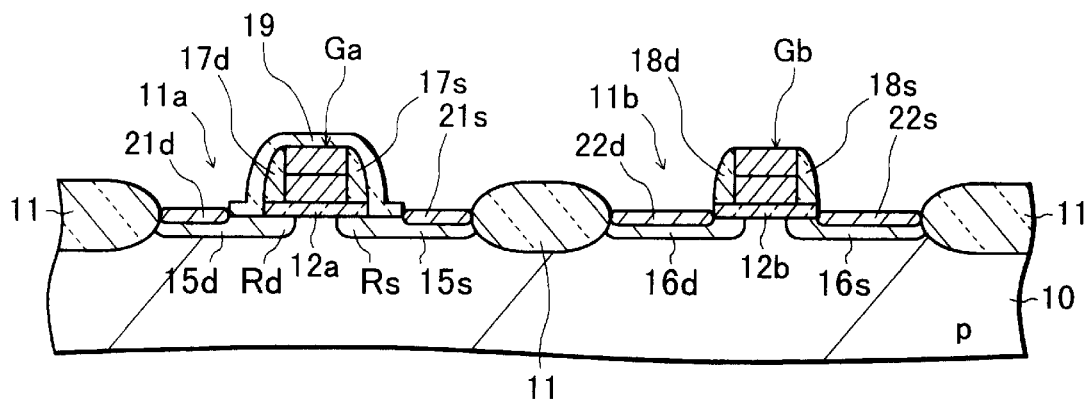
Figure 23:
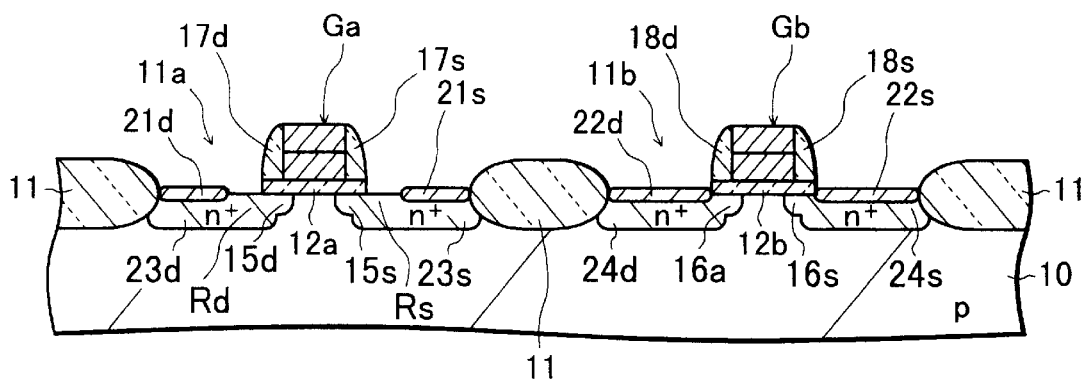

FIG. 20 shows an enlarged view of the cross sectional structure of the transistor $T_4$. Those portions that are the same as in FIG. 9C and FIG. 19 are labeled the same, and will not be described again in detail.

The $n^+$ type source region $58N_1$, the p type well region $32_p$, and the $n^+$ type drain region $58N_2$ constitute a lateral bipolar transistor BP. The drain silicide layer $60N_4$ is connected to the pad electrode PD via the connection point $X_2$. The source silicide layer $60N_2$, the gate silicide layer $60N_7$, and the well region $32_p$ are connected to a power supply line of low potential $V_{SS}$. A resistance component corresponding to the resistor $R_1$ is provided between the source silicide layers $60N_1$ and $60N_2$. A resistance component corresponding to the resistor $R_2$ is provided between the drain silicide layers $60N_3$ and $60N_4$.

If, for example, an excessively large input such as ESD is applied to the pad electrode PD during the manufacture or transport of the IC, the collector pn junction of the transistor BP will undergo restorable breakdown, and current will flow along the path of resistor $R_2$ to transistor BP to resistor $R_1$ and be absorbed by the power supply line of low potential $V_{SS}$. Accordingly, the transistors $T_1$ and $T_2$ inside the output buffer OB, and the transistors of the internal circuits are protected from excessively large input. A protection operation similar to this can also be performed when the power supply line of high potential $V_{DD}$ in the transistor $T_3$ is decreased in potential by one cause or another.

In FIGS. 9A to 9C, when the protection circuit PC is structured using the transistors $T_1$ and $T_2$ in which the source and drain regions have been reduced in resistance by the silicide layers $60P_5$, $60P_6$, $60N_5$, and $60N_6$, the current in the vicinity of the gate insulation film tends to accumulate and lead to thermal breakdown of the gate insulation film, so the protection function is inadequate. One possible way to deal with this is to increase the transistor size, but this in disadvantageous in terms of increasing the level of integration.

In this embodiment, as shown in FIG. 19, the protection circuit PC was structured using a transistor $T_3$ having a resistance component corresponding to the resistors $R_3$ and $R_4$ in the source and drain regions, and using a transistor $T_4$ having a resistance component corresponding to the resistors $R_1$ and $R_2$ in the source and drain regions, so the accumulation of current in the vicinity of the gate insulation film is moderated, and the gate insulation film is less prone to thermal breakdown. Therefore, the desired protection function can be obtained without a particularly large transistor size, which is an advantage in terms of higher integration.

The present invention is not limited to the above embodiment, and can be implemented in a variety of modified embodiments as well. For instance, the following modifications (1) to (6) are possible.

(1) In the step in FIGS. 1A to 1C, the gate insulation films 36a to 36d may be patterned in the same pattern as the gate pattern used in the patterning of the gate-use poly-Si layers 38a to 38d.

(2) The gate electrode layer is not limited to a poly-Si layer, and a polycide layer comprising a silicide layer superposed over a poly-Si layer or the like may be used instead. When a polycide layer is used as the gate electrode layer, the silicide conversion at the upper portion of the polycide layer may be omitted from the silicide conversion treatment discussed for FIGS. 8A to 8C.

(3) The impurity doping was performed in the order of p type impurities, n type impurities, p type impurities, and n type impurities, but may be performed in a different order instead.

(4) p type impurities may be doped instead of n type impurities in order to lower the resistance of the terminal components $Q_1$ and $Q_2$ of the poly-Si layer 38R.

(5) A poly-Si layer that has been doped with conductive impurities may be used instead of a non-doped poly-Si layer as the gate-use poly-Si layers 38a to 38d shown in FIGS. 1A to 1C and the resistor-use poly-Si layer 38R shown in FIGS. 10A to 10B. An advantage to this is that the resistance values will be easier to control. As an example, the sheet resistance of a poly-Si layer that has undergone silicide conversion is about 5 Ω per square, whereas an n type poly-Si layer that has not undergone silicide conversion has a sheet resistance of about 35 Ω per square and can be utilized as a high-resistance material. It order to use an n type poly-Si layer as the poly-Si layers 38a to 38d and 38R, after the non-doped poly-Si layer has been deposited on the upper surface of the substrate by CVD, and before the gate and resistor patterning discussed in relation to FIGS. 1A to 1C and FIGS. 10A to 10C has been performed, P (phosphorus) or other such n type impurities should be doped in a high concentration into said non-doped poly-Si layer using a diffusion furnace or the like so as to convert the entire non-doped poly-Si layer to n type (this n type conversion is also possible after the patterning). In a case such as this, p type impurities are counter doped into the n type poly-Si layer that makes up the poly-Si layers 38a and 38b by the ion implantation treatment shown in FIGS. 3A to 3C and FIGS. 6A to 6C, and if the concentration of the n type impurities is about the same as the concentration of the p type impurities, they will cancel one another out, making it difficult to suppress variance of the impurity concentration. In view of this, even if p type impurities have been doped, n type impurities are doped in advance during the n type conversion of the poly-Si layers in a high enough concentration to allow the p type impurities to be ignored. As a result, the n type impurities become dominant, and variance in the impurity concentration brought about by the introduction of p type impurities can be suppressed. In this case, with the ion implantation shown in FIGS. 3A to 3C and FIGS. 6A to 6C, there is no problem if p type impurities are doped into the poly-Si layer 38R shown in FIGS. 12 and 15, so the resist layers 42R and 52R can be omitted.

(6) The protection circuit PC may be connected on the input side of the input buffer circuit, rather than on the output side of the output buffer OB, so that the input component of the IC is protected.

What is claimed is:

1. A method for manufacturing a semiconductor device, comprising the steps of:

(a) providing a substrate having a continuous first silicon region;

(b) forming a insulating layer and a conductive gate electrode on said first silicon region, said first silicon region being divided by said gate electrode into a composite source region and a composite drain region;

(c) forming an insulating first mask layer on said composite source region, said composite source region being divided into a source node region and a source contact region by said first mask layer, and forming an insulating second mask layer in said composite drain region, said composite drain region being divided into a drain node region and a drain contact region by said second mask layer; and (d) forming a silicide layer on each of said source node region and said source contact region and on said drain node region and said drain contact region, using said first and second mask layers as a mask.

2. A method for manufacturing a semiconductor device as defined in claim 1, wherein said step (b) includes:

(b-1) a step of forming a gate insulation film on all surfaces of said first silicon region; and said method further comprising the step of:

(e) removing said gate insulating film located in said source node region and source contact region and said drain node region and said drain contact region prior to said step (d).

3. A method for manufacturing a semiconductor device as defined in claim 1, further comprising the step of:

(e) using said gate electrode as a mask, doping impurities into said first silicon region that links said source node region and said source contact region, and into that region that links said drain node region and said drain contact region.

4. A method for manufacturing a semiconductor device as defined in claim 1, wherein said step (d) is a step for performing a silicide conversion treatment in a state in which a silicide-forming metal is in contact with said exposed first silicon region, and removing the unreacted silicide-forming metal.

5. A method for manufacturing a semiconductor device as defined in claim 1, wherein said step (d) includes the step of:

(d-1) forming a silicide layer on said gate electrode.

6. A method for manufacturing a semiconductor device as defined in claim 1, further comprising the steps of:

(e) doping impurities into said first silicon region using said gate electrode and said first and second mask layers as a mask following said step (c);

(f) forming side spacers on the side walls of said gate electrode by isotropically depositing an insulating material film so as to cover said gate electrode and anisotropically etching back said insulating material film; and (g) forming a source region and a drain region in said first silicon region by doping impurities into said first silicon region using said gate electrode and said side spacers as a mask that links said source node region and said source contact region, and into that region that links said drain node region and said drain contact region.

7. A method for manufacturing a semiconductor device as defined in claim 6, wherein said step (a) includes the step of:

(a-1) forming a gate insulation film on said first silicon region; and said step (f) involves removing the gate insulation film located in said source node region and said source contact region and said drain node region and said drain contact region.

8. A method for manufacturing a semiconductor device as defined in claim 1, wherein said step (a) is a step for providing a substrate having first and second silicon regions;

said step (b) includes the step of forming another conductive gate electrode on said second silicon region so that it is divided into another source region and another drain region; and said step (d) includes the step of forming a silicide layer on said second silicon region located in said other source region and said other drain region.

9. A method for manufacturing a semiconductor device as defined in claim 8, wherein said step (a) includes the step of:

(a-1) forming a gate insulation film on said first and second silicon region; further comprising the step of:

(e) removing said gate insulation film located in said first and second composite source region, said first and second composite drain region, said other source region, and said other drain region prior to said step (d).

10. A method for manufacturing a semiconductor device as defined in claim 8, further comprising the step of:

using said gate electrode as a masks doping impurities into that region of said first silicon region that links said first and second composite source region, into that region that links said first and second composite drain, and into said second silicon region located in said other source region and said other drain region, and thereby forming source and drain regions in said first and second silicon regions, respectively.

11. A method for manufacturing a semiconductor device as defined in claim 8, wherein said step (d) comprises a step for performing a silicide conversion treatment in a state in which a silicide-forming metal is in contact with said exposed first and second silicon regions, and removing the unreacted silicide forming metal.

12. A method for manufacturing a semiconductor device as defined in claim 8, wherein said step (d) includes the step of:

(d-1) forming a silicide layer on said one and other gate electrodes.

13. A method for manufacturing a semiconductor device as defined in claim 8, further comprising the steps of:

(e) doping impurities into said first and second silicon regions using said one and other gate electrodes and said first and second mask layers as a mask following said step (c);

(f) forming side spacers on the side walls of said one and other gate electrodes by isotropically depositing an insulating material film so as to cover said one and other gate electrodes and anisotropically etching back said insulating material film; and (g) forming a source node region and a drain node region in said first silicon region and forming a source region and a drain region in said second silicon regions by using said one and other gate electrodes and said side spacers as a mask and doping impurities into that region of said first silicon region that links said first and second composite source region, into that region that links said first and second composite drain region, and into said second silicon region located in said source region and said drain region.

14. A method for manufacturing a semiconductor device as defined in claim 13, wherein said step (a) includes the step of:

(a-1) forming a gate insulation film on said first and second silicon regions; and said step (f) involves removing the gate insulation film located in said first and second composite source region, said first and second composite drain region, said source region, and said drain region by said etching back.

15. A method for manufacturing a semiconductor device as defined in claim 1, wherein said step (c) comprises the steps of:
(c-1) successively forming an insulating mask material layer and a first resist layer so that they cover said gate insulation film and said one and other gate electrodes; and
(c-2) forming said first and second mask layers by patterning said first resist layer through photolithography and etching said mask material layer.

16. A method for manufacturing a semiconductor device as defined in claim 1, wherein said step (a) is a step for providing a substrate having first and second silicon regions;
said step (b) includes a step for forming another gate electrode on said second silicon region so that it is divided into another composite source region and other composite drain region;
said step (c) includes a step for forming an insulating third mask in said other source disposition component so that said other composite source region is divided into third and fourth composite source region, and forming an insulating fourth mask in said other composite drain region so that said other composite drain region is divided into third and fourth composite drain region;
said method further comprises the steps of:
(e) forming a source node region and a drain node region in said first silicon region by doping first impurities into that region of said first silicon region that links said first and second composite source region and into that region that links said first and second composite drain region; and
(f) forming a source node region and a drain node region in said second silicon region by doping second impurities of the opposite conduction type as that of said first impurities into that region of said second silicon region that links said third and fourth source disposition components and into that region that links said third and fourth composite drain region;
and wherein said step (d) is a step for forming a silicide layer on said second silicon region located in said third and fourth composite source region and said third and fourth composite drain region.

17. A method for manufacturing a semiconductor device as defined in claim 16, wherein said first and second silicon regions are opposite conduction types.

18. A method for manufacturing a semiconductor device as defined in claim 16, wherein said step (d) is a step for performing a silicide conversion treatment in a state in which a silicide-forming metal is in contact over said exposed first and second silicon regions, and removing the unreacted silicide-forming metal.

19. A method for manufacturing a semiconductor device as defined in claim 16, wherein said step (d) includes the step of:
(d-1) forming a silicide layer on said one and other gate electrodes.

20. A method for manufacturing a semiconductor device as defined in claim 16, further comprising the steps of:
(g) doping third impurities into said first silicon region using said one gate electrode and said first and second mask layers as a mask prior to said step (e);
(h) doping fourth impurities of the opposite conduction type as that of said third impurities into said second silicon region using said other gate electrode and said third and fourth mask layers as a mask; and
(i) forming side spacers on the side walls of said one and other gate electrodes by isotropically depositing an insulating material film so as to cover said one and other gate electrodes and anisotropically etching back said insulating material film;
and wherein said step (e) is a step for forming a source region and a drain region in said first silicon region using said one gate electrode and said side spacers as a mask; and
said step (f) is a step for forming a source region and a drain region in said second silicon region using said other gate electrode and said side spacers as a mask.

21. A method for manufacturing a semiconductor device as defined in claim 20, wherein said step (a) includes a step for forming a gate insulation film on said first and second silicon regions; and
said step (i) involves removing the gate insulation film located in said first to fourth composite source regions and said first to fourth composite drain regions by said etching back.

22. A method for manufacturing a semiconductor device as defined in claim 20, wherein said first and third impurities are the same conduction types, and said second and fourth impurities are the same conduction types.

23. A method for manufacturing a semiconductor device, comprising the steps of:
(a) providing a substrate having a silicon region;
(b) forming a field insulation film having element holes located in said silicon region;
(c) covering the silicon surface inside said element holes to form a gate insulation film;
(d) forming a gate-use polysilicon layer on said gate insulation film and forming a resistance-use polysilicon layer on said gate insulation film so that said element holes are divided into a source disposition component and a drain disposition component;
(e) forming a first mask layer so that said source disposition component is divided into a first source disposition component and a second source disposition component, forming a second mask layer so that said drain disposition component is divided into a first drain disposition component and a second drain disposition component, and forming a third mask layer so that the resistance component in said resistance-use polysilicon layer is covered and the terminal component is exposed;
(f) selectively introducing said first impurities to the silicon region surface inside said element holes, using said first mask layer, said second mask layer, said gate-use polysilicon layer laminated to said gate insulation film, and said field insulation film as a mask in a state in which the introduction of the first impurities into said gate-use polysilicon layer is permitted, and introducing said first impurities into the terminal component of said resistance-use polysilicon layer, using said third mask layer as a mask, which results in the formation of first source and first drain regions corresponding to said first source disposition component and said first drain disposition component, respectively, and in the formation of source contact and drain contact regions in said second source disposition component and said second drain disposition component, respectively, while the resistance of said gate-use polysilicon layer and the resistance of the terminal component of said resistance-use polysilicon layer are decreased;

(g) depositing an insulating side spacer material film that covers said gate insulation film, said gate-use polysilicon layer, the terminal component of said resistance-use polysilicon layer, said first through third mask layers, and said field insulation film;

(h) forming first and second side spacers on the side walls facing said first source and first drain regions in said gate-use polysilicon layer and forming a third side spacer on the side wall of the terminal component in said resistance-use polysilicon layer by subjecting said side spacer material film to an etch-back treatment so that said first through third mask layers remain, while exposing as components intended for silicide conversion the portion of said first source region interposed between said first side spacer and said first mask layer, the portion of said first drain region interposed between said second side spacer and said second mask layer, the portion of said source contact region not covered by said first mask layer, and the portion of said drain contact region not covered by said second mask layer, and exposing as components intended for silicide conversion the upper part of said gate-use polysilicon layer and the upper part of the terminal component of said resistance-use polysilicon layer;

(i) forming a first resist layer so that said third mask layer is covered and the terminal component of said resistance-use polysilicon layer and said element holes are exposed;

(j) selectively introducing said second impurities to the silicon region surface inside said element holes, via said first and second mask layers and using said field insulation film and the gate component including said gate insulation film, said gate-use polysilicon layer, and said first and second side spacers as a mask in a state in which the introduction of the second impurities into said gate-use polysilicon layer is permitted, and introducing said second impurities into the terminal component of said resistance-use polysilicon layer, using said first resist layer as a mask, which results in the formation of second source and second drain regions corresponding to said source disposition component and said drain disposition component, respectively, and in a decrease in the resistance of said gate-use polysilicon layer and the resistance of the terminal component of said resistance-use polysilicon layer; and (k) removing said first resist layer, then using said gate insulation film, said gate-use polysilicon layer, said first through third side spacers, said first through third mask layers, and said field insulation film as a mask to perform a silicide conversion treatment in a state in which a silicide-forming metal is in contact with those parts of said first source region, said source contact region, said first drain region, and said drain contact region that are intended for silicide conversion, the part of said gate-use polysilicon layer intended for silicide conversion, and the part of the terminal component of said resistance-use polysilicon layer intended for silicide conversion, and then removing the unreacted portion of the silicide-forming metal, which results in the formation of first and second source silicide layers in the part of said first source resin intended for silicide conversion and in the part of said source contact region intended for silicide conversion, and in the formation of first and second drain silicide regions in the part of said first drain region intended for silicide conversion and in the part of said drain contact region intended for silicide conversion, which results in the determination of a first resistance component corresponding to said first mask layer between said first and second source silicide layers, and in the determination of a second resistance component corresponding to said second mask layer between said first and second drain silicide layers, while forming a gate silicide layer and a terminal-use silicide layer at the part of said gate-use polysilicon layer intended for silicide conversion and at the part of the terminal component of said resistance-use polysilicon layer intended for silicide conversion, respectively.

24. A method for manufacturing a semiconductor device, comprising the steps of:

(a) providing a substrate having a continuous first silicon region;

(b) forming a gate insulating layer and a conductive gate electrode on said first silicon region being divided into a composite source region and a composite drain region;

(c) forming an insulating first mask layer in said composite source region, said composite source region being divided into a first composite source region and a second composite source region, and forming an insulating second mask layer in said composite drain region being divided into a drain node region and a drain contact region by said second mask layer, where said source contact region is formed at the other side of said gate electrode and said drain contact region is formed at the other side of said gate electrode; and (d) forming a silicide layer on each of said source node region and said source contact region and on said drain node region and drain contact region, using said first and second mask layers as a mask.

* * * * *